(12) United States Patent
Haukka et al.

(10) Patent No.: US 7,419,903 B2
(45) Date of Patent: Sep. 2, 2008

(54) THIN FILMS

(75) Inventors: Suvi P. Haukka, Helsinki (FI); Ivo Raaijmakers, Bilthoven (NL); Wei Min Li, Espoo (FI); Juhana Kostamo, Espoo (FI); Hessel Sprey, Kessel-Lo (BE)

(73) Assignee: ASM International N.V. (NL)

( * ) Notice: Subject to any disclaimer, the term of this patent is extended or adjusted under 35 U.S.C. 154(b) by 329 days.

(21) Appl. No.: 11/106,220

(22) Filed: Apr. 13, 2005

(65) Prior Publication Data

US 2005/0181555 A1     Aug. 18, 2005

Related U.S. Application Data

(63) Continuation-in-part of application No. 10/253,859, filed on Sep. 23, 2002, now Pat. No. 6,933,225, which is a continuation of application No. 09/800,757, filed on Mar. 6, 2001, now Pat. No. 6,534,395.

(60) Provisional application No. 60/187,423, filed on Mar. 7, 2000.

(51) Int. Cl.
*H01L 21/4763* (2006.01)

(52) U.S. Cl. .................. 438/627; 438/643; 438/653; 438/674; 438/678; 438/783; 438/787

(58) Field of Classification Search .................. None
See application file for complete search history.

(56) References Cited

U.S. PATENT DOCUMENTS 4,058,430 A     11/1977   Suntola et al.

(Continued)

FOREIGN PATENT DOCUMENTS

EP        1063687        12/2000

(Continued)

OTHER PUBLICATIONS

Singer, Atomic Layer Deposition Targets Thin Films, Semiconductor International, Sep. 1, 1999, 1 page.

(Continued)

*Primary Examiner*—Zandra Smith
*Assistant Examiner*—Pamela E Perkins
(74) *Attorney, Agent, or Firm*—Knobbe Martens Olson & Bear LLP

(57) ABSTRACT

Thin films are formed by formed by atomic layer deposition, whereby the composition of the film can be varied from monolayer to monolayer during cycles including alternating pulses of self-limiting chemistries. In the illustrated embodiments, varying amounts of impurity sources are introduced during the cyclical process. A graded gate dielectric is thereby provided, even for extremely thin layers. The gate dielectric as thin as 2 nm can be varied from pure silicon oxide to oxynitride to silicon nitride. Similarly, the gate dielectric can be varied from aluminum oxide to mixtures of aluminum oxide and a higher dielectric material (e.g., $ZrO_2$) to pure high k material and back to aluminum oxide. In another embodiment, metal nitride (e.g., WN) is first formed as a barrier for lining dual damascene trenches and vias. During the alternating deposition process, copper can be introduced, e.g., in separate pulses, and the copper source pulses can gradually increase in frequency, forming a transition region, until pure copper is formed at the upper surface. Advantageously, graded compositions in these and a variety of other contexts help to avoid such problems as etch rate control, electromigration and non-ohmic electrical contact that can occur at sharp material interfaces. In some embodiments additional seed layers or additional transition layers are provided.

17 Claims, 14 Drawing Sheets

U.S. PATENT DOCUMENTS

| | | | |
|---|---|---|---|
| 4,486,487 | A | 12/1984 | Skarp |
| 4,747,367 | A | 5/1988 | Posa |
| 4,761,269 | A | 8/1988 | Conger et al. |
| 5,071,670 | A | 12/1991 | Kelly |
| 5,294,286 | A | 3/1994 | Nishizawa et al. |
| 5,306,666 | A | 4/1994 | Izumi |
| 5,320,719 | A | 6/1994 | Lasbmore et al. |
| 5,449,314 | A | 9/1995 | Meikle et al. |
| 5,769,950 | A | 6/1998 | Takasu et al. |
| 5,795,495 | A | 8/1998 | Meikle |
| 5,916,365 | A | 6/1999 | Sherman |
| 6,124,189 | A | 9/2000 | Watanabe et al. |
| 6,153,935 | A | 11/2000 | Edelstein et al. |
| 6,174,799 | B1 | 1/2001 | Lopatin et al. |
| 6,174,809 | B1 | 1/2001 | Kang et al. |
| 6,200,893 | B1 | 3/2001 | Sneh |
| 6,294,836 | B1 | 9/2001 | Paranjpe et al. |
| 6,329,704 | B1 | 12/2001 | Akatsu et al. |
| 6,362,526 | B1 | 3/2002 | Pramanick et al. |
| 6,365,502 | B1 | 4/2002 | Paranjpe et al. |
| 6,368,954 | B1 | 4/2002 | Lopatin et al. |
| 6,368,961 | B1 | 4/2002 | Lopatin et al. |
| 6,399,522 | B1 | 6/2002 | Tsan et al. |
| 6,482,262 | B1 | 11/2002 | Elers et al. |
| 6,534,395 | B2 | 3/2003 | Werkhoven et al. |
| 6,686,271 | B2 | 2/2004 | Raaijmakers et al. |
| 6,703,708 | B2 | 3/2004 | Werkhoven et al. |
| 6,800,552 | B2 | 10/2004 | Elers et al. |
| 6,933,225 | B2 | 8/2005 | Werkhoven et al. |
| 6,955,986 | B2 | 10/2005 | Li |
| 6,986,914 | B2 | 1/2006 | Elers |
| 2001/0041250 | A1 | 11/2001 | Werkhoven et al. |
| 2002/0006468 | A1 | 1/2002 | Paranjpe et al. |
| 2002/0027286 | A1 | 3/2002 | Sundararajan et al. |
| 2002/0102838 | A1 | 8/2002 | Paranjpe et al. |
| 2003/0032281 | A1 | 2/2003 | Werkhoven et al. |
| 2003/0064607 | A1 | 4/2003 | Leu et al. |
| 2003/0082296 | A1 | 5/2003 | Elers et al. |
| 2003/0201537 | A1 | 10/2003 | Lane et al. |
| 2003/0232510 | A1 | 12/2003 | Buchanan et al. |
| 2004/0005753 | A1 | 1/2004 | Kostamo et al. |
| 2004/0071878 | A1 | 4/2004 | Schuhmacher |
| 2004/0121616 | A1 | 6/2004 | Satta et al. |
| 2004/0175928 | A1 | 9/2004 | Abell |
| 2005/0009325 | A1 | 1/2005 | Chung et al. |
| 2005/0212139 | A1 | 9/2005 | Leinikka |
| 2006/0078679 | A1 | 4/2006 | Elers et al. |
| 2006/0216932 | A1 | 9/2006 | Kumar et al. |

FOREIGN PATENT DOCUMENTS

| | | |
|---|---|---|
| GB | 2372042 | 8/2002 |
| GB | 2372043 | 8/2002 |
| GB | 2372044 | 8/2002 |
| WO | WO 00/47404 | 8/2000 |
| WO | WO 00/47796 | 8/2000 |
| WO | WO 00/54320 | 9/2000 |
| WO | WO 00/61833 | 10/2000 |
| WO | WO 01/29280 A1 | 4/2001 |
| WO | WO 01/29893 | 4/2001 |
| WO | WO 01/66832 | 9/2001 |
| WO | WO 0199166 | 12/2001 |
| WO | WO 2004064147 A | 7/2004 |
| WO | WO 2004114398 A | 12/2004 |

OTHER PUBLICATIONS

Abeles, et al., Amorphous Semiconductor Superlattices, Physical Review Letters, Vo. 51, No. 21, pp. 2003-2006.

Bai, High K Gate Stack for Sub-0.1 UM CMOS Technology, Electrochemical Society Proceedings, vol. 99-100, pp. 39-44 (1999).

Del Prado, et al., "Full composition range silicon oxynitride films deposited by ECR-PECVD at room temperature," Thin Solid Films, vol. 344, pp. 437-440 (1999).

Desu, et al, Enhanced Dielectric Properties of Modified $Ta_2O_5$ Thin Films, Mat Res. Innovat (1999) 2:299-302.

Hiltunen, et al., Nitrades of Titanium, Niobium, Tantalum and Molybdenum Grown as Thin Films by the Atomic Layer Epitaxy Method, Thin Solid Films, 166 (1988) pp. 149-154.

Ihanus, et al, ALE Growth of $ZnS_{1-x}Se_x$ Thin Films by Substrating Surface Sulfur with Elemental Selenium, Applied Surface Science 112 (1997) 154-158.

Kaizuka, et al., Conformal Chemical Vapor Deposition TiN (111) Film Formation as an Underlayer of Al for Highly Reliable Interconnects, jpn. J. Appl. Phys. vol. 33 (1994) pp. 470-474.

Kikkawa, et al., A Quarter-Micrometer Interconnection Technology Using a TiN/Al-Si-Cu/TiN/Al-Si-Cu/TiN/Ti Multilayer Structure, IEEE Transactions on Electron Devices, vol. 40, No. 2 Feb. 1993.

Kikkawa, et al., Al-Si-Cu/TiN Multilayer Interconnection and Al-Ge Reflow Sputtering Technologies for Quarter-Micron Devices, 54/SPIE vol. 1805 Submicrometer Metallization (1992).

Kim, et al., The Effects of Substrate and Annealing Ambient on the Electrical Properties of $Ta_2O_5$ Thin Films Prepared By Plasma Enhanced Chemical Vapor Deposition, Thin Films Solids 253 (1994) pp. 453-439.

Kukli, et al., Atomic Layer Epitxy Growth of Tantalum Oxide Thin Films from $Ta(OC_2H_5)$ and $H_2O$, J. Electochem. Soc. vol. 142, No. 5, May 1995 pp. 1670-1674.. Lee et al., JP 2000058777 (English Abstract).

Lee et al. JP 2000058777 (English Abstract).

Leskela, et al., Atomic Layer Epitaxy in Deposition of Various Oxide and Nitride Thin Films, Journal De Physique IV, Colloque C5, Supplement au Journal de Physique II, vol. 5, Jun. 1995.

Lucovsky, "Integration of Alternative High-K Gate Dielectrics into Aggressively Scaled CMOS Si Devices: Chemical Bonding Constraints at Si-Dielectric Interfaces," Electrochemical Society Proceedings, vol. 99-10, pp. 69-80 (1999).

Maiti, et al., "Improved ultrathin oxynitride formed by thermal nitridation and low pressure chemical vapor deposition process," Applied Physics Letter, vol. 61, No. 15, pp. 1790-1792 (1992).

Martensson, et al., Use of Atomic Layer Epitaxy for Fabrication of Si/TiN/Cu Structures, J.Vac Sci. Technol.B 17(5), Sep./Oct. 1999, pp. 2122-2128.

Min, et al., Atomic Layer Deposition of TiN Films by Alternate Supply of Tetrakis (ethylmethylamino)-Titanium and Ammonia, Jpn. J. Appl. Phys. vol. 37 (1998) pp. 4999-5004.

Min, et al., Atomic Layer Deposition of TiN Thin Films by Sequential Introduction of Ti precursor and $NH_3$. Mat. Res. Soc. Symp. Proc. vol. 514 1996 Materials Research Society.

Nakajima, et al., "Atomic-layer-deposited silicon-nitride/$SiO_2$ stacked gate dielectrics for highly reliable p-metal-oxide-semiconductor filed-effect transistors," Applied Physics Letters, vol. 77, No. 18, pp. 2855-2857 (2000).

Nakajima, et al., "Low-temperature formation of silicon nitride gate dielectrics by atomic-layer deposition," Applied Physics Letters, vol. 79, No. 5, pp. 665-667 (2001).

Niinisto et al., Synthesis of Oxide Thin Films and Overlayers by Atomic Layer Epitaxy for Advanced Applications, Materials Science and Engineering B41 (1996) 23-29.

Ritala, et al., Atomic Layer Epitaxy Growth of tiN Thin Films from $TiI_4$ and $NH_3$, J. Electrochemical Soc., vol. 145, No. 8, Aug. 1998 pp. 2914-2920.

Ritala, et al., "Controlled Growth of TaN, $Ta_3N_5$, and $TaO_xN_y$ Thin Films by Atomic Layer Deposition," Chem. Mater., vol. 11, pp. 1712-1718 (1999).

Ritala, et al, Perfectly Conformal TiN and $Al_2O_3$ Films Deposited by Atomic Layer Deposition, Communications, Chemical Vapor Deposition 1999, 5, No. 1, pp. 7-9.

Ritala, et al., Zirconium Dioxide Thin Films Deposited by ALE Using Zirconium Tetrachloride as Precursor, Applied Surface Science, 75 (1994) pp. 333-340.

Sakaue, et al., Digital Chemical Vapor Deposition of SiO.sub.2 Using a Repetitive Reaction of TriethylsilanelHydrogen and Oxygen, Japanese Journal of Applied Physics, vol. 30, No. 1B, Jan. 1990, pp. L124-L127.

Sneh, et al., Atomic Layer Growth of SiO.sub.2 on Si(100) Using SiCl.sub.4 and H.sub.2 O in a Binary Reaction Sequence, Surface Science 334 (1995) 135-152.

Tiita, et al., Phosphorus-Doped Alumina, vol. 33, No. 9 pp. 1319-1323.

Tiita, et al., Preparation and Characterization of Phosphorus-Doped Aluminum Oxide Thin Films, Materials Research Bulletin, vol. 33, No. 9 pp. 1315-1323 1998.

Vehkamaki, et al., Growth of SrTiO.sub.3 and BaTiO.sub.3 Thin Films by Atomic Layer Deposition, Department of Chemistry. University of Helsinki. FIN-00014. Helsinki, Finland, Electronic and Solid State Letters, 2 (10) (1999) Letters Online.

Wise et al, Diethyldiethoxysilane as a New Precursor for SiO.sub.2 Growth of Silicon, Mat. Res. Soc. Symp. Proc. vol. 334, pp. 37-43.

Atomic Layer Deposition Targets Thin Films, Wafer Processing, Semiconductor International, Sep. 1999.

Hoyas et al. Growth and Characterization of Atomic Layer Deposited WCO.7NO.3 on Polymer Films, Journal of Applied Physics, Jan. 1, 2004, 95(1):381-388.

Klaus et al., "Atomic layer deposition of tungsten using sequential surface chemistry with a sacrificial stripping reaction," *Thin Solid Films* 360, 145-153 (2000).

Koh et al. "Meeting the Cu diffusion barrier challenge using ALD tungsten nitride carbide," *Solid State Technology*, 54-58 (Jun. 2005).

Lai et al., "Precursors for Organometallic Chemical Vapor Deposition of Tungsten Carbide Films," *Chem. Mater*, 7, 2284-2292 (1995).

Nakajima et al. "Chemical Vapor Deposition of Tungsten Carbide, Molybdenum Carbide Nitride, and Molybdenum Nitride Films," *J. Electrochem. Soc.*, vol. 144, No. 6 (Jun. 1997).

Schumacher et al., "Integration of ALD WCN Into a Dual Damascene Oxide Module,".

International Search Report, PCT/US2006/005868.

International Search Report, PCT/US01/06746.

Office Action dated Dec. 14, 2007, received in U.S. Appl. No. 11/359,884, in 18 pages.

U.S. Appl. No. 11/359,884, filed Feb. 21, 2006, Kumar et al.

plated Cu    426

ALD Cu       436a

ALD W        436b

ALD WNC      432 low-k        402 plated Cu    426

ALD Cu    436a

ALD W-ALD WNC (graded)    436b'

ALD WNC    432 low-k    402 plated Cu    426

ALD Cu – ALD W (graded)    436a'

ALD W – ALD WNC (graded)    436b'

ALD WNC    432 low-k    402

$M^1$ 730

$M^2$ 720

$M^2N_x, M^2N_xC_y, M^2C_x$ 710

$M^1$ (such as Cu) 780

$M^2$ (such as Ru) 770

$M^3$ (such as W) 760

THIN FILMS

REFERENCE TO RELATED APPLICATION

The present application is a continuation in part of U.S. patent application Ser. No. 10/253,859, filed Sep. 23, 2002, now U.S. Pat. No. 6,933,225 which is a continuation of application Ser. No. 09/800,757, file Mar. 6, 2001, now U.S. Pat. No. 6,534,395, issued Mar. 18, 2003, which claims priority benefit under 35 U.S.C. §119(e) to provisional application No. 60/187,423, filed Mar. 7, 2000, all hereby incorporated by reference in their entireties.

FIELD OF THE INVENTION

The present invention relates generally to forming layers in integrated circuits. More particularly, the invention relates to thin films with controlled composition by atomic layer deposition.

BACKGROUND OF THE INVENTION

There are numerous semiconductor process steps involved in the development of modern day integrated circuits (ICs). From the initial fabrication of silicon substrates to final packaging and testing, integrated circuit manufacturing involves many fabrication steps, including photolithography, doping, etching and thin film deposition. As a result of these processes, integrated circuits are formed of microscopic devices and wiring amid multiple layers.

A basic building block of the integrated circuit is the thin film transistor (TFT). The transistor includes a gate dielectric layer sandwiched between a "metal" layer and the semiconductor substrate, thus the acronym "MOS" for metal-oxide-semiconductor. In reality, the gate electrode is typically formed of conductively doped silicon rather than metal. The gate dielectric most commonly employed is $SiO_2$ or silicon dioxide.

Today's market demands more powerful and faster integrated circuits. In pursuit of such speed and lower power consumption, device packing densities are continually being increased by scaling down device dimensions. To date, this scaling has reduced gate electrode widths to less than 0.25 μm. Currently, commercial products are available employing gate widths or critical dimensions of 0.18 μm or less. The scaling rules that apply to these small devices call for very thin gate oxide layers, which have grown smaller with each generation of MOS integrated circuits. The thickness of gate oxides is made as small as possible, thereby increasing switching speed. Conventional gate oxide layers may be inadequate in several respects as dimensions are continuously scaled.

Extremely thin silicon dioxide gate dielectrics exhibit undesirable phenomena such as quantum-mechanical tunneling. In the classical sense, the oxide represents a relatively impenetrable barrier to injection of electrons into the conduction-band of the silicon if they possess kinetic energies smaller than 3.1 eV. However, the electron exhibits a finite probability of crossing the barrier even if the electron does not possess sufficient kinetic energy. This probability increases with larger gate electric fields and/or thinner gate oxides. For oxide thicknesses smaller than 3 nm the direct tunneling current becomes large enough that it removes carriers faster than they can be supplied by thermal generation. As a result, silicon dioxide gate dielectrics are likely to reach a lower scaling limit of about 1.5 nm to 2 nm.

Another problem with thin gate oxides is their susceptibility to dopant diffusion from the overlying gate electrode. A polysilicon gate electrode layer is typically doped with boron for its enhanced conductivity. As the gate oxide thickness is scaled down, boron can easily penetrate through the gate oxide, resulting in instabilities in device properties. Boron penetration into gate dielectrics has such undesirable consequences as positive shifts in threshold voltage, increases in sub-threshold swing, increases in charge trapping, decreases in low-field hole mobility, and degradation of current drive due to polysilicon depletion in p-MOSFETs.

Efforts to address deficiencies of silicon dioxide include nitrogen incorporation into the gate dielectric. Silicon nitride ($Si_3N_4$) has a higher dielectric constant than $SiO_2$, theoretically enabling thinner equivalent oxide thickness for gate dielectrics that are not tunnel-limited, and furthermore serves as an effective barrier against impurity diffusion. However, the interfaces between silicon nitride films and the underlying semiconductor substrate are generally of poor quality, resulting in a high density of charge trapping sites and pinholes, and attendant current leakage. As a consequence, attempts have been made to create $SiO_2$ and $Si_3N_4$ hybrids, such as silicon oxynitride films, for use as gate dielectrics. Conventional methods of incorporating nitrogen into silicon oxide gate dielectrics are difficult to control, however, particularly for ultra-thin gate dielectrics of future generation devices.

Other solutions to scaling problems include the use of high permittivity materials (high K), such as tantalum pentoxide, strontium bismuth tantalate (SBT), barium strontium tantalate (BST), etc. While exhibiting greatly increased dielectric strength, these materials have been difficult to integrate with existing fabrication technology.

Another issue raised by the continual scaling of integrated circuit dimensions is the difficulty of producing adequately conductive metal lines for wiring the circuitry within integrated circuits. One manner of simplifying the process of metallization is by employing damascene techniques. Rather than depositing blanket metal layers and etching away excess metal to leave wiring patterns, damascene processing involves forming templates for wiring by way of trenches in an insulating layer. Metal overfills the trenches and a polishing step removes excess metal outside the trenches. Metal is thus left in a desired wiring pattern within the trenches. Where contact holes or vias extending from the floor of the trenches to lower conductive elements are simultaneously filled with metal, the method is known as dual damascene processing.

Unfortunately, scaling introduces difficulties with damascene processes, particularly when fast diffusing metals like copper are employed for the metal lines and contacts. In order to prevent peeling of metal lines from the surrounding insulation and to prevent diffusion spikes causing shorts across lines, one or more lining layers are formed within the trenches (and vias, in dual damascene processing) prior to metal fill. Typically, metal adhesion layers and metal nitride barrier layers are employed. A metal seed layer may also be needed if the trenches are to be filled by electroplating.

These lining layers occupy a considerable volume of the available trenches, reducing room available for the more highly conductive metal filler. Conductivity is thus reduced relative to the same trenches filled completely with metal. Moreover, employing metal nitride liners, though advantageously containing the metal filler and preventing short circuits, has been known to induce electromigration during circuit operation, leading to voids and further reduced conductivity along the metal lines.

Accordingly, a need exists for thin films that overcome problems associated with gate dielectrics constructed of traditional materials such as silicon nitride and silicon oxide. A need also exists for improved structures and methods for containing metal within damascene trenches without excessive losses in conductivity.

SUMMARY OF THE INVENTION

The aforementioned and other needs are satisfied by several aspects of the present invention.

In accordance with one aspect of the invention, a thin film is provided in an integrated circuit. The film has a small thickness, defined between an upper surface and a lower surface. A controlled, varying composition is provided through this small thickness. Exemplary thicknesses are preferably less than about 100 Å, more preferably less than about 50 Å and can be on the order of 10 Å.

In accordance with one embodiment, the film comprises a gate dielectric for an integrated thin film transistor. In one arrangement, a silicon oxide layer is provided with a graded concentration of nitrogen. Despite the thinness of the layer, such a gradient can be maintained. Advantageously, a relatively pure silicon dioxide can be provided at the lower level for a high quality channel interface, while a high nitrogen content at the upper surface aids in resisting boron diffusion from the polysilicon gate electrode. In another arrangement, other dielectric materials can be mixed in a graded fashion to obtain desirable interface properties from one material and desirable bulk properties from another material, without undesirable sharp interfaces within the gate dielectric. For example, $Al_2O_3$ has a high dielectric constant and desirable interface properties, while $ZrO_2$ has yet a higher dielectric constant, which is desirable for the "bulk" of the gate dielectric.

In accordance with a second embodiment, the film comprises a transition layer between a barrier film and a more conductive wiring material. In the illustrated embodiment, a thin metal nitride layer is provided with a graded concentration of copper. The nitride layer can be made exceedingly thin, leaving more room for more conductive metal within a damascene trench, for example. Advantageously, an effective diffusion barrier with metal nitride can be provided at the lower surface, while a high copper content at the upper surface provides the conductivity needed for service as an electroplating seed layer. The gradual transition also reduces electromigration, as compared to structures having sharp barrier-metal interfaces.

In accordance with another aspect of the invention, a method is provided for forming a thin film in an integrated circuit, with varying composition through its thickness. The method includes alternatingly introducing at least a first species and a second species to a substrate in each of a plurality of deposition cycles while the substrate is supported within a reaction chamber. A third species is introduced to the substrate in a plurality of the deposition cycles. The amount of the third species can vary in the different cycles in which it is introduced. Alternatively, the third species is supplied in its own source gas pulse, which pulse is employed with increasing or decreasing frequency as the thin film deposition proceeds (e.g., none during a first stage, every fourth cycle during a second stage, every cycle during a third stage, etc.).

Advantageously, the amount of the impurity varies between zero during early deposition cycles and a maximum amount during late deposition cycles. In one example, a silicon source gas adsorbs upon the substrate in a first phase of each cycle, while an oxidant source gas in a second phase of the cycle forms silicon oxide. After a relatively pure silicon oxide covers the substrate surface, small amounts of a nitrogen source gas are introduced during the second phase. The amount of nitrogen source gas increases with each cycle thereafter. The amount of oxidant during the second phase can also decrease, such that a pure silicon nitride upper surface most preferably results, with graded nitrogen content between the upper and lower surfaces of the dielectric. Similarly, in a second example, tungsten, reducing and nitrogen sources provide metal nitride in first through third phases. A copper source and reducing agents in fourth and fifth phases provide copper. In successive cycles, the relative proportions of the first through third phases (producing no more than about one monolayer of WN) and the fourth through fifth phases (producing no more than about one monolayer of Cu) changed. The increases/reductions can be altered step-wise, e.g., every two cycles, every three cycles, every five cycles, etc.

According to another aspect of the invention, selectively introduced impurity phases or pulses can replace atoms of a previous phase in a thermodynamically favored substitution reaction. Grading can be accomplished by varying the frequency of the impurity phase through the atomic layer deposition process. Alternatively, the frequency of the impurity phase can be kept constant while the duration of the impurity phase is varied throughout the deposition process, or a combination of varying frequency and duration can be employed.

Due to the fine control provided by atomic layer deposition, this grading can be provided in very thin layers. Moreover, the low temperatures during the process enables maintenance of the desired impurity content profile.

In some aspects, the invention is a method of forming a liner layer with a varying composition in a damascene trench. The method comprises placing a substrate in a reaction chamber, introducing first metal and a non-metal vapor phase reactants in alternate and temporally separated pulses to the substrate in a plurality of atomic layer deposition (ALD) cycles, and introducing varying amounts of a second metal vapor phase reactant to the substrate during said plurality of deposition cycles.

In some aspects, the invention is a method of forming a metal, non-metal, and copper containing thin film in a dual damascene trench. The method comprises placing a substrate in a reaction chamber and introducing varying amounts of a metal precursor, a non-metal precursor, and a copper precursor in alternate and temporally separated pulses to the substrate in a plurality of atomic layer deposition (ALD) cycles, wherein a lower surface of the thin film and an upper surface of the thin film have different copper concentrations.

In some aspects, the invention is a method of producing a liner layer. The method comprises depositing a first layer via an atomic layer deposition (ALD) process onto a substrate, wherein the first layer comprises tungsten, nitrogen, and carbon. The method further comprises depositing a second layer via an ALD process over the first layer, wherein the second layer comprises tungsten, and depositing a third layer via an ALD process over the second layer, wherein the third layer comprises copper.

In some aspects, the invention is a graded liner layer in a damascene trench. The liner comprises a first non-graded layer. The first non-graded layer comprises a first compound. The liner further comprises a second non-graded layer, above the first non-graded layer. The second non-graded layer comprises a first metal. Between the first and second non-graded layers is a first transition layer comprising both the first compound and the first metal, and wherein the first transition layer has greater than 90% step coverage. The liner further comprising a third non-graded layer, above the second non-graded layer. The third non-graded layer comprises a second metal, wherein between the second and third non-graded layers is a second transition layer that comprises the first metal and the second metal. The layers are located within a damascene trench.

In some aspects, the invention is a liner layer. The layer comprises a first non-graded layer comprising a barrier compound, a second non-graded layer, above the first non-graded layer, the second non-graded layer essentially consisting of tungsten, and a third non-graded layer comprising a seed compound, wherein the third non-graded layer is above the second non-graded layer.

In some aspects, the invention is a method of forming a thin film. The method comprises placing a substrate in a reaction chamber and introducing a first and a second vapor phase reactant in alternate and temporally separated pulses to the substrate in a plurality of first deposition cycles. The method further comprises introducing varying amounts of a third vapor phase reactant and a fourth vapor phase reactant in a plurality of second deposition cycles to the substrate during the plurality of first deposition cycles and introducing a fifth and a sixth vapor phase reactants in alternate and temporally separated pulses to the substrate in a plurality of third deposition cycles.

BRIEF DESCRIPTION OF THE DRAWINGS

These and further aspects of the invention will be readily apparent to those skilled in the art from the following description and the attached drawings, wherein.

DETAILED DESCRIPTION OF THE PREFERRED EMBODIMENTS

Figure 1:
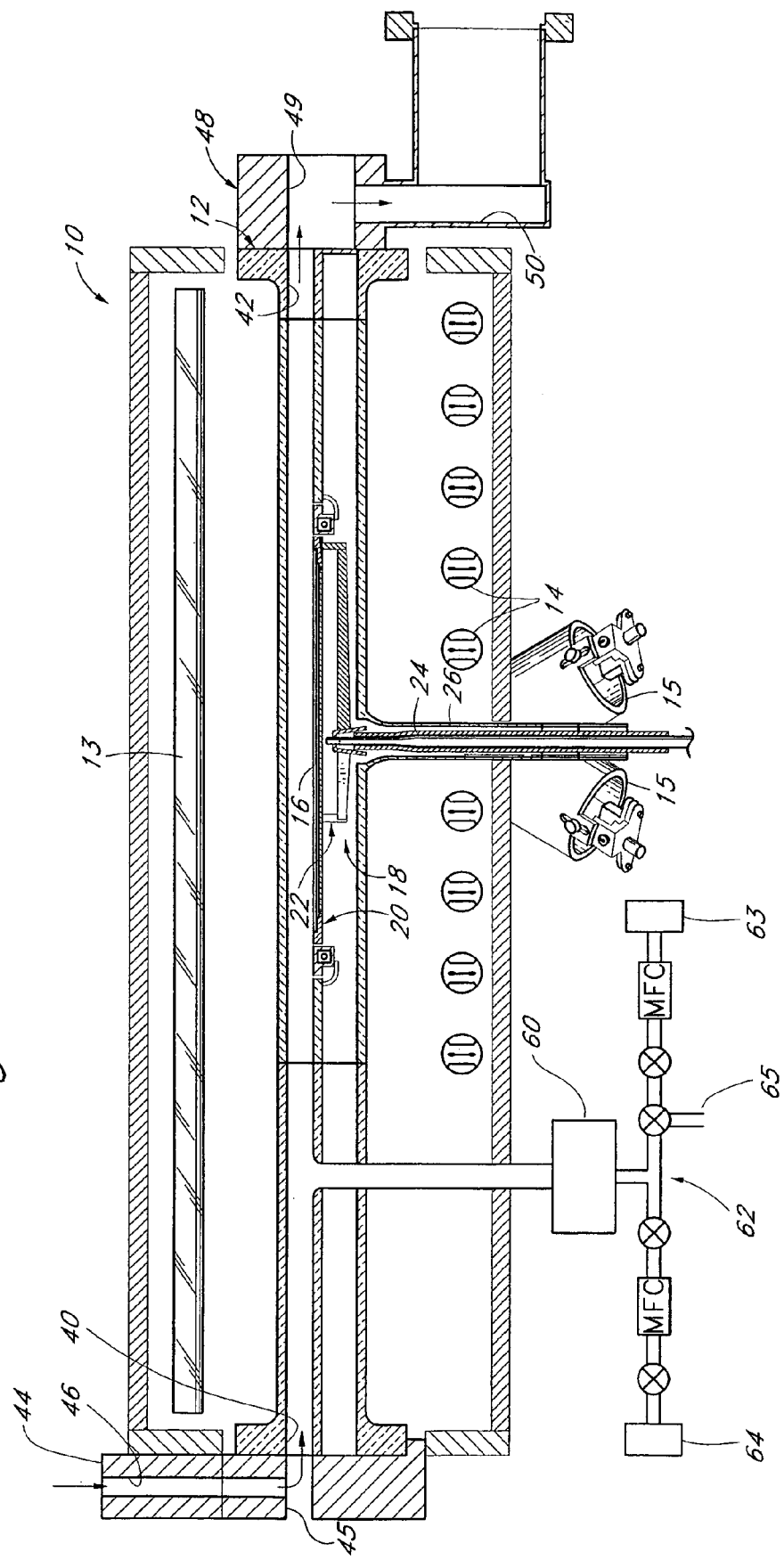
FIG. 1 is a partially schematic, sectional view of a single-substrate reaction chamber, including some surrounding reactor components, for use in conjunction with preferred embodiments of the present invention.

Although described in the context of graded gate dielectric layers in an integrated transistor stack and graded transitions from barrier to metal layers, the skilled artisan will readily find application for the principals disclosed here in a number of other contexts. The processes and layer structures disclosed herein have particular utility where extremely thin layers are desired with tailored concentrations of impurities through the thickness of the layer. For example, a transition can occur between an adhesion layer, a barrier layer, a seed layer, various subparts of a layer, and/or between multiple layers of the same type (e.g., two seed layers). Additionally, in some embodiments, more than one transition layer occurs in a single compound layer, such as a liner layer.

It is often desirable to provide a graded or otherwise varying composition through the thickness of a film in an integrated circuit. Sharp boundaries between different layers can disadvantageously demonstrate poor adhesion, undesirable electrical qualities, lack of process control, etc.

For very thin films, for example thinner than 10 nm, it is very difficult to realize precisely tailored profiles with conventional fabrication methods. The preferred embodiments, however, employ atomic layer deposition (ALD), which facilitates the formation of thin films monolayer by monolayer. Indeed, control exists on a smaller than monolayer scale, due to steric hindrance of bulky source chemical molecules producing less than one monolayer per cycle. The capability of layering atomically thin monolayers enables forming more precise concentration gradients from the lower surface (e.g., gate oxide/Si substrate interface) to the upper surface (e.g., gate electrode/gate dielectric interface).

Accordingly, the preferred embodiments provide methods of more precisely tailoring impurity content in thin layers formed within integrated circuits. The illustrated embodiments described below thus include methods of building up a thin film in discrete steps of monolayers of material and are thus species of atomic layer deposition (ALD). The composition of each discrete layer can be tailored by selectively introducing the desired chemistry for each monolayer to be deposited. For example, by means of ALD, a particular combination of introduced gases react with, deposit or adsorb upon the workpiece until, by the nature of the deposition chemistry itself, the process self-terminates. Regardless of the length of exposure, the process gases do not contribute further to the deposition. To deposit subsequent monolayers, different chemical combinations are introduced in the process chamber such as will react with or adsorb upon the previously formed monolayer. Desirably, the second chemistry or a subsequent chemistry forms another monolayer, also in a self-limiting manner. These self-limiting monolayers are alternated as many times as desired to form a film of suitable thickness.

The very nature of this method allows a change of chemistry for each discrete cycle. Accordingly, the composition of the resulting thin film can be changed incrementally, for example, in each cycle, in every second cycle, or in any other desired progression. Additionally, because ALD can be conducted at very low temperatures, relative to conventional thermal oxidation and conventional CVD processes, diffusion during the process can be effectively limited. For the purpose of illustrating a ratio between oxide thickness and corresponding number of layers, a thin film of 2 nm silicon oxide, for example, contains about seven (7) monolayers. In accordance with the illustrated embodiment, seven monolayers of silicon oxide can be formed in about 18-22 cycles of an ALD process. Thus, even for such an extremely thin layer, the composition can be changed such that a different impurity concentration can be incorporated into the first monolayer as compared to that incorporated into the seventh monolayer.

In addition to the transition layers described above, other layers and methods of making such layers with superior properties are also contemplated. In particular, herein provided are other compositions and methods for assisting in the deposition of the seed layers for electroplating. It has been discovered that ALD metal processes are facilitated on relatively pure metallic surfaces compared to metal nitride or oxide surfaces. Thus, a pure metal layer that serves as an initial base for a seed layer, or a "base seed layer," is also provided. Thus, in some embodiments, a liner layer created through multiple rounds of ALD is improved through the use of two seed layers, including an initial base seed layer, which sits directly on the barrier layer, and the normal or external seed layer, that is the top surface of the liner layer. Copper deposited by metal-organic chemical vapor deposition (MOCVD) can be used also as a normal or external seed layer. In some embodiments, there is a transition layer between these seed layers.

Preferred Process Reactor

FIG. 1 shows a chemical vapor deposition (CVD) reactor 10, including a quartz process or reaction chamber 12, constructed in accordance with a preferred embodiment, and for which the methods disclosed herein have particular utility. The illustrated reactor 10 comprises a process module commercially available under the trade name Epsilon™ from ASM America, Inc., of Phoenix, Ariz., adapted to include a remote plasma source. While the preferred embodiments are discussed in the context of a single-substrate CVD reactor, it will be understood that the disclosed processes will have application in CVD reactors of other types, having reaction chambers of different geometries from those discussed herein. In other arrangements, the preferred processes can be conducted in a reactor commercially available under the trade name Pulsar™ 2000 from ASM Microchemistry, Ltd. of Finland, specifically designed for ALD.

A plurality of radiant heat sources are supported outside the chamber 12, to provide heat energy to the chamber 12 without appreciable absorption by the quartz chamber 12 walls. While the preferred embodiments are described in the context of a "cold wall" CVD reactor for processing semiconductor wafers, it will be understood that the processing methods described herein will have utility in conjunction with other heating/cooling systems, such as those employing inductive or resistive heating.

The illustrated radiant heat sources comprise an upper heating assembly of elongated tube-type radiant heating elements 13. The upper heating elements 13 are preferably disposed in spaced-apart parallel relationship and also substantially parallel with the reactant gas flow path through the underlying reaction chamber 12. A lower heating assembly comprises similar elongated tube-type radiant heating elements 14 below the reaction chamber 12, preferably oriented transverse to the upper heating elements 13. Desirably, a portion of the radiant heat is diffusely reflected into the chamber 12 by rough specular reflector plates above and below the upper and lower lamps 13, 14, respectively. Additionally, a plurality of spot lamps 15 supply concentrated heat to the underside of the wafer support structure, to counteract a heat sink effect created by cold support structures extending through the bottom of the reaction chamber 12.

Each of the elongated tube type heating elements 13, 14 is preferably a high intensity tungsten filament lamp having a transparent quartz envelope containing a halogen gas, such as iodine. Such lamps produce full-spectrum radiant heat energy transmitted through the walls of the reaction chamber 12 without appreciable absorption. As is known in the art of semiconductor processing equipment, the power of the various lamps 13, 14, 15 can be controlled independently or in grouped zones in response to temperature sensors.

A workpiece or substrate, preferably comprising a silicon wafer 16, is shown supported within the reaction chamber 12 upon a substrate or wafer support structure 18. Note that, while the substrate of the illustrated embodiment is a single-crystal silicon wafer, it will be understood that the term "substrate" broadly refers to any structure on which a layer is to be deposited. The support structure 18 includes a susceptor 20, a quartz support spider 22 extending from a shaft 24 through a depending tube 26, and numerous surrounding elements that facilitate laminar gas flow and uniform temperatures across the wafer 16.

The illustrated reaction chamber 12 includes an inlet port 40 for the introduction of reactant and carrier gases, and the wafer 16 can also be received therethrough. An outlet port 42 is on the opposite side of the chamber 12, with the wafer support structure 18 positioned between the inlet 40 and outlet 42.

An inlet component 44 is fitted to the reaction chamber, adapted to surround the inlet port 40, and includes a horizontally elongated slot 45 through which the wafer 16 can be inserted. The slot 45 is selectively sealed by a gate valve (not shown) during operation. A generally vertical inlet 46 receives gases from remote sources, and communicates such gases with the slot 45 and the inlet port 40.

The reactor also includes remote sources (not shown) of process gases, which communicate with the inlet 46 via gas lines with attendant safety and control valves, as well as mass flow controllers ("MFCs") that are coordinated at a gas panel, as will be understood by one of skill in the art.

For the first illustrated embodiment, gas sources include tanks holding a silicon-containing gas, preferably a silane such as monosilane ($SiH_4$), silicon tetrachloride ($SiCl_4$), dichlorosilane (DCS or $SiH_2Cl_2$), trichlorosilane (TCS or $SiHCl_3$), or other silane or halosilane silicon sources; an oxidant source gas, such as $O_2$, $O_3$, O radicals, $H_2O$, NO or $N_2O$; and a nitrogen source gas, such as $NH_3$. Metal source gases can also be employed for deposition of high k metal oxides. For the second embodiment, source gases include one or more metal source gases (e.g., $WF_6$, $TiCl_4$, CuCl, etc.), a nitrogen source gas (e.g., $NH_3$) and a reducing agent (e.g., triethyl boron or TEB).

The silicon sources can include a bubbler and a gas line for bubbling $H_2$ through a liquid solution such as TCS, to more effectively transport silicon-containing gas molecules to the reaction chamber in gaseous form. Many metal sources can similarly include liquid solutions and bubblers. The reactor 10 can also include other source gases, such as dopant gases, including phosphine ($PH_3$), arsine ($AsH_3$), and/or diborane ($B_2H_6$); etchants for cleaning the reactor walls (e.g., HCl); a germanium source for doping or formation of SiGe films; etc.

In the illustrated embodiment, an optional generator of excited species, commonly referred to as a remote plasma generator 60, is provided remotely or upstream from the reaction area, and preferably upstream from the chamber 12. An exemplary remote excited species generator is available commercially under the trade name TR-850 from Rapid Reactive Radicals Technology GmbH of Munich, Germany. As known in the art, the generator 60 couples power to a gas to generate excited species. In the illustrated embodiment, the generator 60 couples microwave energy from a magnetron to a flowing gas in an applicator along a gas line 62. A source of precursor gases 63 is coupled to the gas line 62 for introduction into the excited species generator 60. A source of carrier gas 64 is also coupled to the gas line 62. One or more further branch lines 65 can also be provided for additional reactants. As is known in the art, the gas sources 63, 64 can comprise gas bombs, bubblers, etc., depending upon the form and volatility of the reactant species. Each gas line can be provided with separate mass flow controllers (MFC) and valves, as shown, to allow selection of relative amounts of carrier and reactant species introduced to the generation 60 and thence into the reaction chamber 12.

An outlet component 48 mounts to the process chamber 12 such that an exhaust opening 49 aligns with the outlet port 42 and leads to exhaust conduits 50. The conduits 50, in turn, communicate with suitable vacuum means (not shown) for drawing process gases through the chamber 12 and to reduce pressure, if desired.

Graded Gate Dielectrics

As noted above, the trend in integrated circuit fabrication is to further miniaturize devices. With devices getting smaller, it is becoming increasingly more difficult to deposit thin layers, such as gate oxide layers, by conventional means. Furthermore, the nature of silicon oxide layers will need to change to address desired electrical characteristics of gate dielectrics.

Gate dielectrics in integrated transistors should not only have low defect densities but should also resist diffusion of impurities from the overlying gate electrode into the gate dielectric. Silicon oxide has been successfully used now for decades as a gate dielectric material, but today's circuit designs impose the use of thinner and thinner layers. As a result of the thinner layers, dopant (e.g., boron) diffusion becomes more of a problem.

Incorporation of nitrogen into the gate dielectric film can effectively reduce boron diffusion. As has been recognized elsewhere in the art, however, nitride at the channel interface leads to poor interface properties and consequently poor electrical performance. Accordingly, a resultant dielectric structure has pure silicon oxide at the channel interface and silicon nitride at higher levels.

Conventionally, silicon oxide gate dielectric films are made by thermal oxidation of the underlying silicon substrate. To incorporate nitrogen, nitrogen-containing gases can be added to the main oxygen stream, and/or a post-deposition treatment can be performed with nitrogen-containing gases or nitrogen implantation. Such methods can either incorporate nitrogen into the oxide material to form silicon oxynitride ($SiO_xN_y$) or form a $Si_3N_4$ layer over the oxide. In either case, it is difficult to control the nitrogen content in the film, especially for current and future generation of integrated circuit devices where the gate dielectric material is very thin (e.g., less than 7 nm). For such ultrathin dielectrics, conventional methods of incorporating nitrogen into a gate dielectric cannot be controlled to produce uniform electrical characteristics across the substrate while still minimizing nitrogen content at the interface with the substrate.

The first embodiment involves alternating adsorption of no more than about a monolayer of silicon with oxidation of the previously adsorbed monolayer in an alternating layer silicon oxide process. During the oxidation stage, nitrogen can also be selectively incorporated. Essentially, by mixing these two gases, oxynitride films with any desired ratio of oxygen to nitrogen can be grown. In the preferred embodiment, varying reactant ratios during the cyclical process, the composition formed by each cycle can be tailored. Most preferably, the deposition begins with pure silicon oxide and ends with pure silicon nitride, with any desired grading through the thickness.

The substrate upon which deposition is to occur is initially prepared for the self-limiting deposition process. In the illustrated embodiment, the substrate is a semiconductor material in which a transistor channel is formed. The semiconductor substrate can be formed of an epitaxial layer or formed of the top portions of an intrinsically doped silicon wafer. In other arrangements, the substrate can comprise alternative materials, such as III-V semiconductors.

Surface preparation desirably leaves a surface termination that readily reacts with the first reactant in the preferred ALD process. In the illustrated embodiment, wherein a dielectric layer is to be formed over a single-crystal silicon layer or wafer, the bare silicon surface preferably is terminated with hydroxyl (OH) tails. As will be appreciated by the skilled artisan, such a surface termination can be readily obtained simply by exposure a clean room atmosphere after a wafer clean.

In accordance with the preferred embodiment, at least one workpiece or wafer is loaded into the process chamber and readied for processing. Purge gas is preferably flowed through the chamber to remove any atmospheric contaminants.

Temperature and pressure process parameters can be modified to attain the desired film characteristics. If necessary, the wafer is ramped to the desired process temperature by increasing power output to the lamps 13, 14 and 15. Advantageously, however, the illustrated self-limiting reaction can be conducted at low temperatures, such that the reactor can be maintained constantly at the reaction temperature without ramping between workpiece changes. The desired pressure level, if other than atmospheric, can be attained using a conventional vacuum pump as known by those skilled in the art. For the present silicon oxynitride process, for example, it is preferable to maintaining a process temperature of between about 100° C. and 500° C., more preferably between about 200° C. and 400° C., and most preferably between about 300° C. and 400° C. Desirably, the process is also relatively insensitive to pressure, though the preferable pressure range is between about 1 Torr and 100 Torr, and more preferably between about 5 Torr and 15 Torr.

In an alternate embodiment of the present invention, the self-limiting reaction can take place at even lower temperatures. Using remote-plasma excited oxygen and/or nitrogen sources, even room temperature processing is plausible. Consequently, inter-diffusion of the discrete layers can be avoided and as long as post-treatments at high temperatures do not take place in an environment of oxygen or nitrogen containing gases, the deposited composition profile will stay intact. As noted above, the plasma generator 60 of FIG. 1 can couple microwave energy to flowing reactant gases to ignite a plasma. Desirably, ionic species recombine prior to entering the process chamber, thereby minimizing damage to the workpiece and the chamber itself, while radicals such as N and O survive to provide boosted reactivity to the oxygen and/or N phases of the process.

When the workpiece is at the desired reaction temperature and the chamber is at the desired pressure level, process and carrier gases are then communicated to the process chamber. Unreacted process and carrier gas and any gaseous reaction by-products are thus exhausted. The carrier gas can comprise any of a number of known non-reactive gases, such as $H_2N_2$, Ar, He, etc. In the illustrated embodiment, $N_2$ is used as the carrier gas.

A first chemical species is then adsorbed upon the prepared deposition substrate. In the illustrated embodiment, the first species comprises a silicon-containing species, and includes at least one other ligand that results in a self-terminating monolayer of the silicon-containing species. For example, the silicon source gas for the deposition of silicon oxide can include: silanes of the formula $Si_mL_{2m+2}$ wherein m is an integer 1-3; siloxanes of the formula $Si_yO_{y-1}L_{2y+2}$ wherein y is an integer 2-4; and silazanes of the $Si_y(NH)_{y-1}L_{2y+2}$ wherein y is an integer 2-4. In these formulae each L can independently be H, F, Cl, Br, I, alkyl, aryl, alkoxy, vinyl (—CH=CH$_2$), cyano (—CN), isocyanato (—NCO), amino, silyl (H$_3$Si—), alkylsilyl, alkoxysilyl, silylene or alkylsiloxane, whereby alkyl and alkoxy groups can be linear or branched and may contain at least one substitute. Volatile silanols and cyclic silicon compounds are examples of other suitable silicon source compounds.

Of these silicon compounds, preferably silanes and silazanes are used for the deposition of pure silicon nitride because siloxanes have a rather strong Si—O bond. Silicon compounds can be purchased, e.g., from Gelest, Inc., 612 William Leigh Drive, Tullytown, Pa. 19007-6308, United States of America.

Most preferably, the silicon source gas comprises dichlorosilane (DCS) or trichlorosilane (TCS) which is introduced into the carrier gas flow. In the preferred reactor, the silicon source gas is flowed at a rate of between about 10 sccm and 500 sccm, more preferably between about 100 sccm and 300 sccm. The silicon source gas is maintained for between about 0.1 second and 1 second under the preferred temperature and pressure conditions, and more preferably for between about 0.3 second and 0.7 second. A monolayer of silicon chemisorbs on the silicon substrate surface terminated with chloride tails or ligands. The surface termination desirably inhibits further reaction with the silicon source gas and carrier gas.

After the pulse of the first species, a second species is provided to the substrate. In the illustrated embodiment, the second species comprises an oxidant, most preferably comprising pure H$_2$O vapor. The H$_2$O is preferably introduced into the carrier gas flow at a rate of between about 10 sccm and 500 sccm, more preferably between about 100 sccm and 300 sccm. Under the preferred temperature and pressure conditions, the H$_2$O pulse is maintained for between about 0.1 second and 1 second under the preferred temperature and pressure conditions, and more preferably for between about 0.3 second and 0.7 second. After the oxidant pulse is turned off, carrier gas is preferably allowed to flow for sufficient time to purge the oxidant from the chamber prior to the next reactant pulse. In other arrangements, it will be understood that the chamber can be evacuated to remove the second reactant species.

During the second reactant pulse, the oxidant reacts with the chloride termination of the previous pulse, leaving oxygen atoms in place of the ligands. Desirably, stoichiometric or near stoichiometric SiO$_2$ is left.

In accordance with the principals of atomic layer deposition, a second pulse of the silicon source gas is then introduced into the carrier gas flow, the pulse is stopped and the silicon source gas removed from the chamber, followed by a second oxidant source gas pulse, which is then in turn stopped and removed from the chamber. These pulses are then continually alternated until the dielectric layer attains its desired thickness.

An impurity source gas is also provided to at least one of the cycles in the alternating process. In the dielectric embodiment shown, the impurity preferably comprises nitrogen, and the impurity source gas preferably comprises ammonia (NH$_3$) or hydrazine (N$_2$H$_4$) added to the alternating process. Both ammonia and hydrazine are fairly reactive gases, making them suitable for low temperature ALD processing. It will be understood, in view of the disclosed embodiment of FIGS. 9-13 below, that in one embodiment, the ammonia is added in separate ammonia phases (each comprising an ammonia pulse and a purge pulse) following silicon phases. The ammonia phases can gradually replace oxidant source gas phases, such as one every ten cycles, gradually increasing to one every other cycle and preferably ending with complete replacement of the oxidant phases. Thus, the alternating process begins depositing silicon oxide (by alternating silicon and oxidant phases); deposits a graded silicon oxynitride with increasing levels of nitrogen in an intermediate portion of the process (by gradually replacing an increasing proportion of the oxidant phases with nitrogen and particularly ammonia phases); and, by the time the desired dielectric thickness is reached, the alternating process deposits silicon nitride (by alternating silicon and ammonia phases).

In the illustrated embodiment, however, ammonia is added to the oxygen phase. Different amounts of NH$_3$ are added to different oxidant source gas pulses throughout the process. Thus, a desired amount of nitrogen can be selectively incorporated into each monolayer of silicon dioxide and a silicon oxynitride layer results with a tailored nitrogen content profile.

The skilled artisan will appreciate, in view of the present disclosure, that the reaction between ammonia and the silicon complex will have a different thermodynamic favorability, as compared to the reaction between the oxidant and the silicon complex. Accordingly, the proportions of ammonia to oxidant do not necessarily equal the proportions of nitrogen to oxygen in the resultant silicon oxynitride. The skilled artisan can readily account for thermodynamic competition through routine experimentation to determine the appropriate parameters for the desired levels of nitrogen incorporation. Providing nitrogen active species through a remote plasma generator, particularly in conjunction with oxygen active species, can maximize the effect of varying the ratio of oxygen to nitrogen sources.

Figure 7:
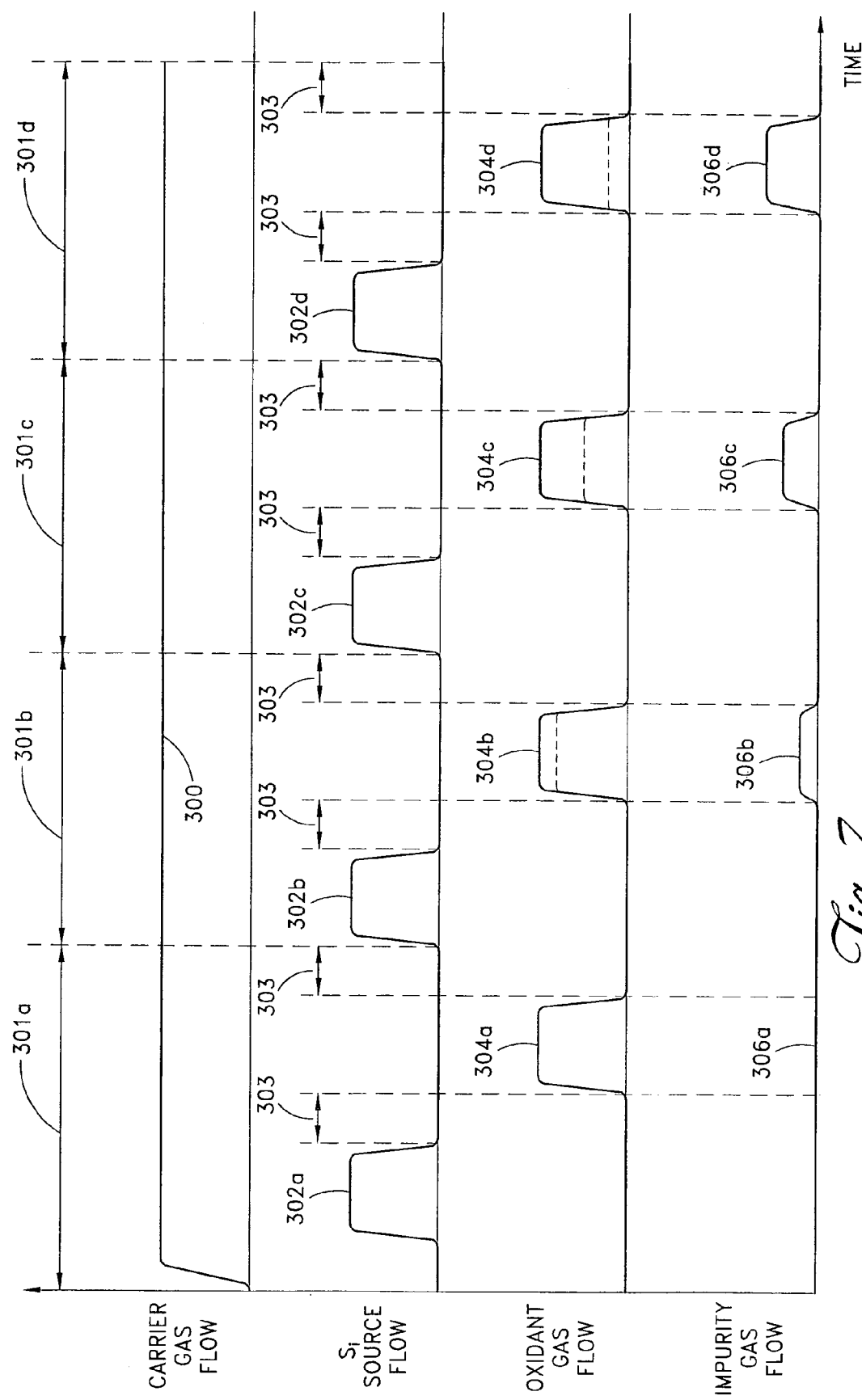
FIG. 7 is an exemplary gas flow diagram in accordance with a method of depositing ultrathin graded dielectric layers.

FIG. 7 is a gas flow diagram in accordance with one embodiment, illustrating the first four cycles 301a-301d in an exemplary self-limiting deposition sequence. The illustrated sequence includes a constant flow of a carrier gas 300. As shown, a first pulse or spike 302a of the silicon source gas is provided to form the first self-terminated silicon monolayer. After a first purge step 303, during which carrier gas continues to flow until the silicon source gas has been removed from the chamber, a first oxidant source gas pulse or spike 304a is provided. After a second purge 303, a second silicon source gas pulse 302b is provided, followed by a second oxidant source gas 304b, a third silicon source gas pulse 302c, a third oxidant source gas pulse 304c, etc. in alternating pulses separated by purge steps 303.

As shown, at some point after the first cycle 301a (forming the first silicon oxide monolayer) a first impurity source gas pulse 306b is provided, preferably during an oxidant source gas pulse 304b. Desirably, a relatively low percentage of the impurity source gas (preferably comprising NH$_3$) is provided during this first pulse 306b. During subsequent oxidant source gas pulses 304c, 304d, etc., progressively greater flows of the impurity source gas are provided in pulses 306c, 306d, etc. Where progressively greater flows of the impurity source gas are employed, it can be advantageous to supply reactants perpendicularly to the substrate surface, such as by way of an overhead showerhead. In the case of competing adsorption of two source chemicals, all of the substrate surface is preferably exposed simultaneously to the gas mixture. Thus concentration gradients from the inlet side to the exhaust side of the substrate can be avoided.

Note that FIG. 7 is schematic only, and not drawn to scale. Additionally, the preferred process conditions actually result in a full monolayer formed after a plurality of cycles. While theoretically the reactants will chemisorb at each available site on the exposed layer of the workpiece, physical size of the adsorbed species (and particularly with terminating ligands) will generally limit coverage with each cycle to a fraction of a monolayer. In the illustrated embodiment, on average roughly 1 Å of $SiO_2$ forms per cycle, whereas a true monolayer of $SiO_2$ is about 3 Å in thickness, such that a full monolayer effectively forms approximately every three cycles, where each cycle is represented by a pair of silicon source gas and oxidant source gas pulses.

Accordingly, the first impurity source gas pulse 306b is preferably conducted after three silicon source gas pulses alternated with three oxidant source gas pulses. In this manner, at least a full monolayer of silicon dioxide is provided prior to introduction of nitrogen doping. More preferably, the first ammonia pulse 306b is provided after six cycles, thereby providing additional insurance against nitrogen diffusion through to the substrate-dielectric interface. In the illustrated embodiment, ammonia is flowed in the first pulse 306b at between about 0 sccm and 10 sccm, more preferably between about 0 sccm and 5 sccm. Thereafter, the ammonia pulses are increased in each cycle by about 50 sccm.

Though not illustrated, the oxidant source gas pulses 304a, 304b, etc. can be reduced in the course of increasing the impurity source gas flow. Accordingly, nitrogen content in the resultant silicon oxynitride dielectric layer can be increased from 0 percent at the lower surface up to stoichiometric $Si_3N_4$ at the upper surface.

Figure 2:
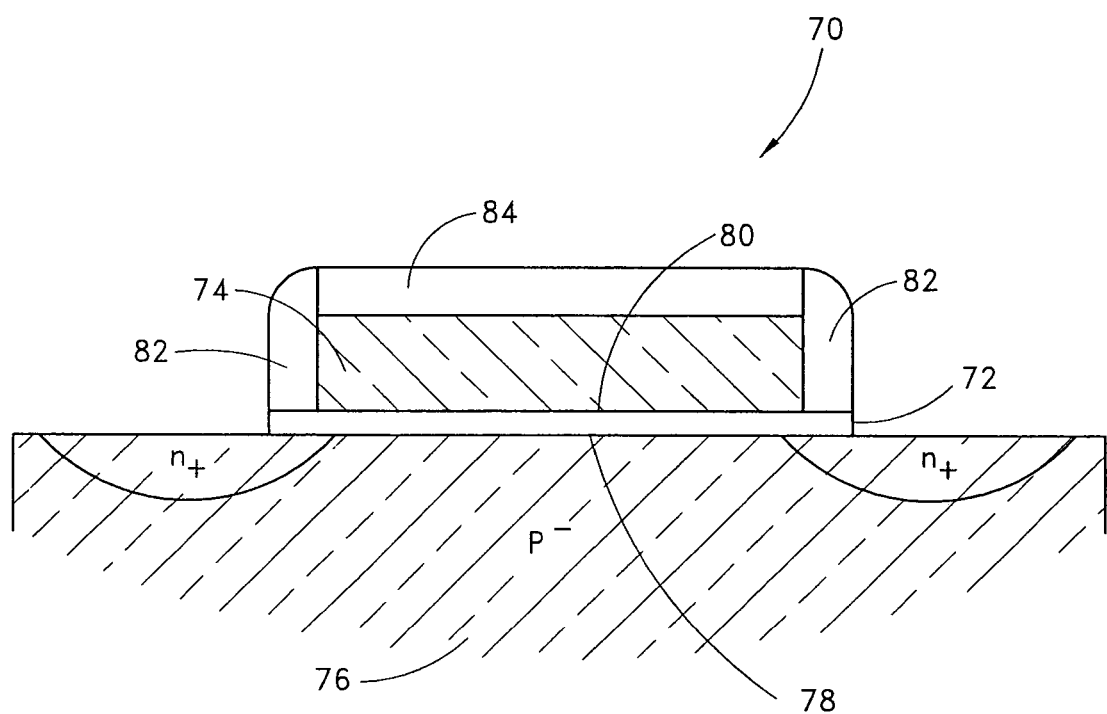
FIG. 2 is a schematic sectional view of a partially fabricated integrated circuit, illustrating a gate dielectric layer sandwiched between a gate electrode and a semiconductor layer.

FIG. 2 shows a schematic sectional view of a transistor structure 70 in a partially fabricated integrated circuit, constructed in accordance with a preferred embodiment, and for which the methods disclosed herein have particular utility. A gate dielectric layer 72 is sandwiched between a gate electrode 74 and a semiconductor substrate 76. The gate dielectric 72 thus extends between a substrate interface 78 and an electrode interface 80. In the illustrated embodiment, the gate electrode 74 comprises a polysilicon layer. The substrate 76 comprises any suitable semiconductor material and in the illustrated embodiment comprises a layer of intrinsically doped single-crystal silicon. In accordance with one embodiment, the gate dielectric 72 comprises silicon oxide having a varying and preferably graded nitrogen content through the thickness thereof. In other embodiments, $Al_2O_3$ can serve as a pure interface with silicon, graded into a higher dielectric constant material such as $ZrO_2$ to provide a higher overall dielectric constant. The gate electrode 74 is additionally protected by sidewall spacers 82 and a dielectric cap layer 84, each of which can comprise conventional insulating materials such as silicon oxide or silicon nitride. The gate electrode 74 can also include high conductivity strapping layers, such as metal nitrides, metal silicides and pure metals, for faster lateral signal transmission.

Figure 3:
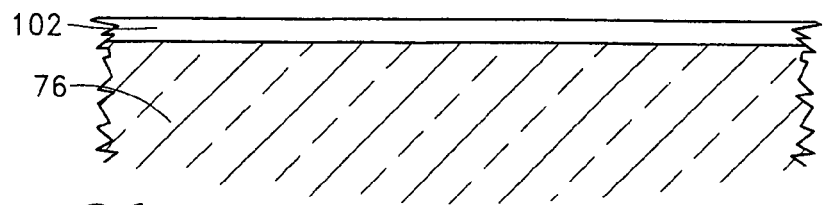
FIGS. 3-6 schematically illustrate monolayer-by-monolayer deposition of a gate dielectric, in accordance with a preferred embodiment of the invention. In the illustrated embodiments, a "monolayer" is formed every few cycles in an alternating, cyclical process.
Figure 4:
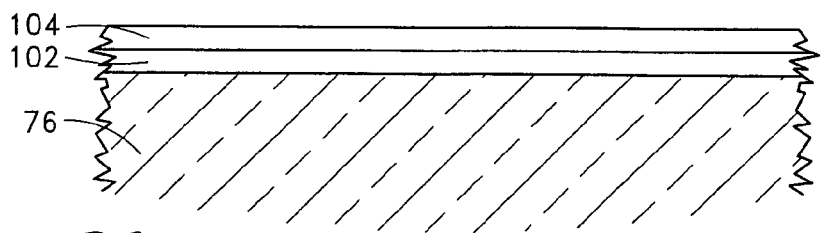
Figure 5:
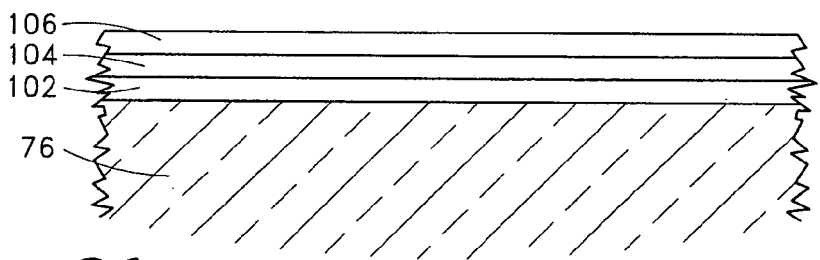

FIGS. 3 through 5 illustrate a sequence of forming the preferred gate dielectric 72 one monolayer at a time. Note that the figures are schematic representations only. In general, the concentration of impurities in each monolayer can vary as desired. In the illustrated embodiment, a linear profile of impurity concentration is preferred. In other arrangements, the impurity concentration can vary exponentially, by step function, etc. through the thickness of thin film.

FIG. 3 illustrates a first monolayer 102 of silicon oxide formed directly on the surface of the semiconductor substrate 76. In accordance with the preferred processing conditions, set forth above with respect to FIG. 7, such a monolayer can be formed after an average of about three cycles of the ALD alternating silicon and oxidant source gas pulses. Desirably, the first or substrate interface monolayer 102 has little or no impurity concentration, preferably lower than about 0.1% impurity, and more preferably the monolayer 102 is formed of pure $SiO_2$.

FIG. 4 illustrates a second monolayer 104 of silicon oxide formed directly on the surface of the first monolayer 102 of silicon oxide. The second monolayer 104 preferably has a low impurity concentration (nitrogen in the preferred embodiment), but greater than the concentration in the preceding monolayer 102.

With reference to FIG. 5, a third monolayer 106 is deposited directly on the surface of the second monolayer 104. In the illustrated embodiment, the third monolayer 106 has yet a higher impurity (nitrogen) concentration than the second monolayer 104. Similarly, a plurality of additional monolayers are deposited one at a time until the desired final thickness is achieved. Each monolayer can have a different impurity concentration and the impurity profile through the thickness of the film can be tailored accordingly.

Figure 6:
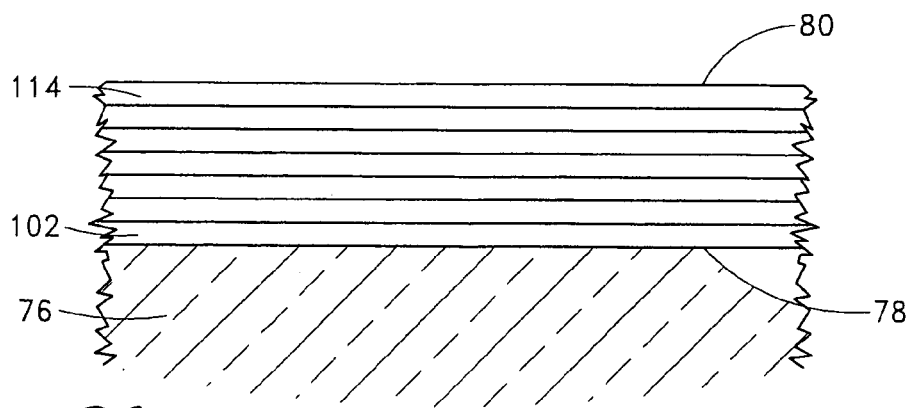

Referring to FIG. 6, a last monolayer 114 is deposited to complete formation of the gate dielectric layer. The last monolayer 114 thus defines the gate electrode interface 80 with conductive material to be deposited thereover. It will be understood, of course, that FIG. 6 is merely schematic and that many more monolayers than the seven illustrated can be employed to form the desired final thickness. Moreover, individual monolayers 102 to 114 would not be sharply definable in the final structure, contrary to the schematic illustration.

In the illustrated embodiments, the impurity concentration is controlled to vary from a lowest concentration at the substrate interface 78 to a highest concentration at the gate electrode interface 80. Preferably, the gate dielectric 72 has a nitrogen concentration at the substrate interface 78 of less than about 0.1%, and more preferably about 0%. Nitrogen content at the gate electrode interface 80, on the other hand, is preferably greater than about 5%, more preferably greater than about 8%, and most preferably greater than about 10%. The nitrogen content between these two interfaces 78, 80 is roughly linearly graded. It will be understood, however, that any other desired grading profile (e.g., parabolic, exponential, elliptical, etc.) can be achieved by tailoring the percentage of nitrogen source gas during each oxidation phase.

The resultant thin film has an actual thickness of less than about 7 nm. Preferably, the gate dielectric has an actual thickness of less than about 6 nm, more preferably less than about 5 nm, and in the illustrated embodiment has a thickness of about 2 nm, including about 7 monolayers. Since the illustrated gate dielectric 72 incorporates a significant nitrogen content, it preferably exhibits an equivalent oxide thickness of less than 2.0 nm, more preferably less than about 1.7 nm and most preferably less than about 1.6 nm. The illustrated linearly graded oxynitride has an equivalent oxide thickness of about 1.7 nm.

Figure 8:
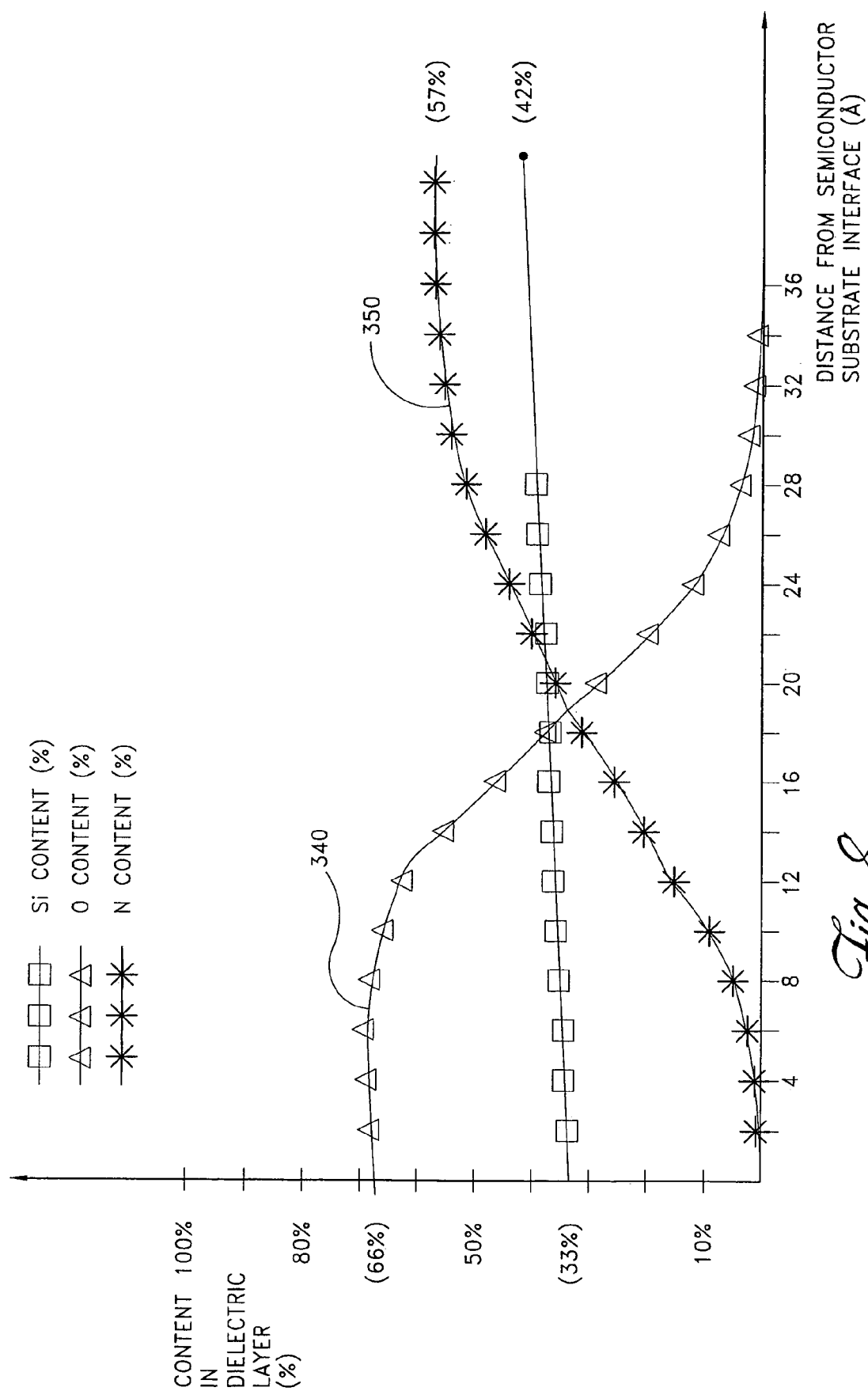
FIG. 8 is a theoretical reverse Auger profile of a graded dielectric layer constructed in accordance with a preferred embodiment.

FIG. 8 is a theoretical reverse Auger profile of a dielectric layer constructed in accordance with a preferred embodiment, illustrating the percentage of impurity content in a dielectric layer as a function of the distance from the semiconductor substrate interface. As shown, in the preferred embodiment, at or near the semiconductor substrate interface, the impurity content 350 (i.e., nitrogen) is at a minimum, whereas the oxygen content 340 is at a maximum. As the distance from the semiconductor substrate interface grows, the impurity concentration 350 increases roughly linearly to a maximum, whereas the oxygen content 340 decrease to a minimum.

Thus, at the substrate interface the gate dielectric preferably comprises nearly pure silicon dioxide ($SiO_2$), whereas near the top of the layer (gate electrode interface) the gate dielectric comprises nearly pure silicon nitride ($Si_3N_4$). It will be understood that such a structure can be created by an ALD process similar to FIG. 7, but where the oxidant pulse amplitudes decrease with every cycle or every few cycles.

Accordingly, despite the extremely low thickness of the preferred gate dielectrics, a precisely controlled impurity content throughout the thickness can be achieved. Thus, in the illustrated embodiment, the interface properties of silicon dioxide are obtained at the substrate surface, while nitrogen is incorporated in the remainder of the gate dielectric to reduce boron penetration and to increase the overall effective dielectric constant of the gate dielectric. Employing ALD enables precise control at the level of atomic layers. Moreover, the low temperatures involved in the deposition allow maintenance of any desired impurity concentration at various points in the thickness, without interdiffusion. In contrast, conventional techniques cannot be so precisely controlled, and tend to result in even distribution of any impurity in such a thin layer, due to diffusion during processing and/or an inherent lack of control during the formation of such a thin gate dielectric layer.

Moreover, grading through the thickness of the layer advantageously enables better control of later processing. For example, the gate dielectric is typically etched over active areas (e.g., source and drain regions of the transistor) in order to form electrical contact to these areas of the substrate. A gradual change in nitrogen content from the upper surface of the gate dielectric down to the substrate interface allows greater control over such etch processes as will be understood by the skilled artisan. Accordingly, damage to the substrate is minimized. The skilled artisan will recognize other advantages to grading profiles in thin films used in integrated circuits.

While the illustrated example comprises grading a nitrogen concentration in a silicon oxide layer, skilled artisan will readily appreciate, in due of the disclosure herein, that the same principles can be applied to forming graded profiles in other gate dielectric materials by ALD. For example, the inventors have found that aluminum oxide advantageously demonstrates a high dielectric constant (k) and also has good interface properties with silicon oxide and/or silicon substrates. Accordingly, a pure aluminum oxide ($Al_2O_3$) layer can be first formed by ALD using alternating pulses of an aluminum source gas and an oxidant.

Exemplary aluminum source gases include alkyl aluminum compounds, such as trimethylaluminum $(CH_3)_3Al$, triethylaluminum $(CH_3CH_2)_3Al$, tri-n-butylaluminum $(n-C_4H_9)_3Al$, diisobutylaluminum hydride $(i-C_4H_9)_2AlH$, diethylaluminum ethoxide $(C_2H_5)_2AlOC_2H_5$, ethylaluminum dichloride $(C_2H_5)_2AlCl_2$, ethylaluminum sesquichloride $(C_2H_5)_3Al_2Cl_3$, diisobutylaluminum chloride $(i-C_4H_9)_2AlCl$ and diethylaluminum iodide $(C_2H_5)_2AlI$. These compounds are commercially available from, e.g., Albemarle Corporation, USA. Other aluminum source gases include aluminum alkoxides containing Al—O—C bonds, such as ethoxide $Al(OC_2H_5)_3$, aluminum isopropoxide $Al[OCH(CH_3)_2]_3$ and aluminum s-butoxide $Al(OC_4H_9)_3$. These compounds are commercially available from, e.g., Strem Chemicals, Inc., USA. The aluminum source can also comprise aluminum beta-diketonates, such as aluminum acetylacetonate $Al(CH_3COCHCOCH_3)_3$, often shortened as $Al(acac)_3$, and tris-(2,2,6,6-tetramethyl-3,5-heptanedionato)aluminum, usually shortened as $Al(thd)_3$, $Al(TMHD)_3$ or $Al(DPM)_3$. Volatile halogenated aluminum beta-diketonates are also commercially available, such as aluminum hexafluoroacetylacetonate $Al(CF_3COCHCOCF_3)_3$, often shortened as $Al(hfac)_3$. These compounds are commercially available from, e.g., Strem Chemicals, Inc., USA. Volatile, purely inorganic aluminum halides such as aluminum chloride $AlCl_3$ or $Al_2Cl_6$, aluminum bromide $AlBr_3$, and aluminum iodide $AlI_3$ may also be used as precursors. At low substrate temperatures, anhydrous aluminum nitrate can be used as an aluminum source chemical for ALD. The synthesis of anhydrous $Al(NO_3)_3$ has been described by G. N. Shirokova, S. Ya. Zhuk and V. Ya. Rosolovskii in *Russian Journal of Inorganic Chemistry*, vol. 21, 1976, pp. 799-802, the disclosure of which is incorporated herein by reference. The aluminum nitrate molecule breaks into aluminum oxide when it is contacted with organic compounds, such as ethers.

Exemplary oxygen source gases include oxygen, water, hydrogen peroxide, ozone, alcohols (e.g., methanol, ethanol, isopropanol), etc.

An exemplary process comprises alternating trimethyl aluminum or TMA with water, with purge pulses or evacuation steps therebetween. Each pulse can have a duration of about 0.5 seconds, and the substrate can be maintained at about 300° C. This process deposits an $Al_2O_3$ layer, which is followed by grading by gradually supplying to the ALD process a source gas that results in more desirable bulk properties (e.g., higher dielectric constant). For example, the TMA pulse can be substituted for a zirconium source gas pulse every few cycles, with increasing frequency until pure zirconium dioxide ($ZrO_2$) is formed. In an exemplary process, $ZrCl_4$ serves as a zirconium source gas and can be deposited at the same temperature (e.g., 300° C.) is the aluminum oxide ALD process. Alternatively, zirconium source gas can be introduced simultaneously and as an increasing proportion of the aluminum source gas during a metal pulse, which is continually alternating with an oxidant pulse. In this case, the skilled artisan can determine through routine experimentation what proportions of aluminum source gas to zirconium source gas should be used to obtain the desired material proportions in the layer. Similarly, the skilled artisan will readily appreciate that other gate dielectric materials can also be created in this fashion.

In the above example of aluminum oxide and zirconium oxide, aluminum oxide serves as a good barrier diffusion with good electrical interface properties, while zirconium dioxide provides a higher overall dielectric constant value for the dielectric. The gate dielectric can again be graded from $ZrO_2$ until aluminum oxide forms for the upper interface, providing a good diffusion barrier against downward boron (B) diffusion from the gate electrode into the gate dielectric.

Another example of a graded material for the gate dielectric is silicon oxide at the lower interface, graded into a pure aluminum oxide for the bulk and upper surface of the gate dielectric.

Graded Interface Between Barrier and Metal Layers

FIGS. 9 through 13 illustrate a second embodiment of the present invention. Rather than a dielectric layer, the second embodiment involves a graded conductive film, for example, a graded transition between a barrier layer (e.g., metal nitride, nitride carbide, or more preferably a metal nitride carbide) and a more conductive filler layer (e.g., elemental metal).

Figure 9:
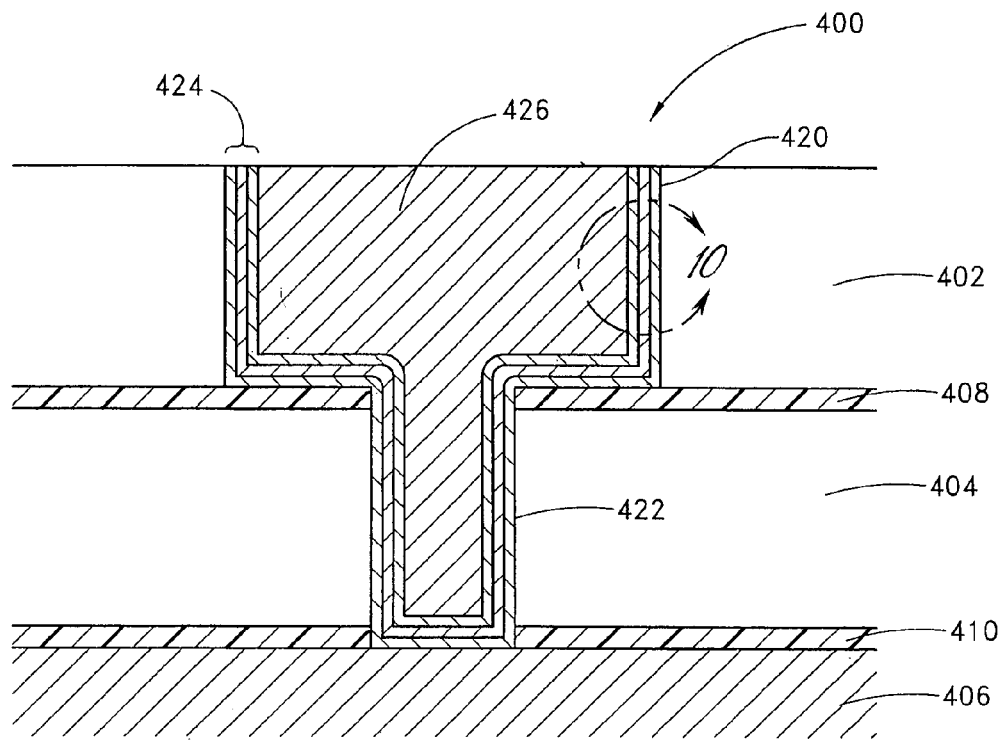
FIG. 9 is a schematic cross-section of a wire and contact formed in a dual damascene trench and via, respectively, including barrier and metal layers.
Figure 10:
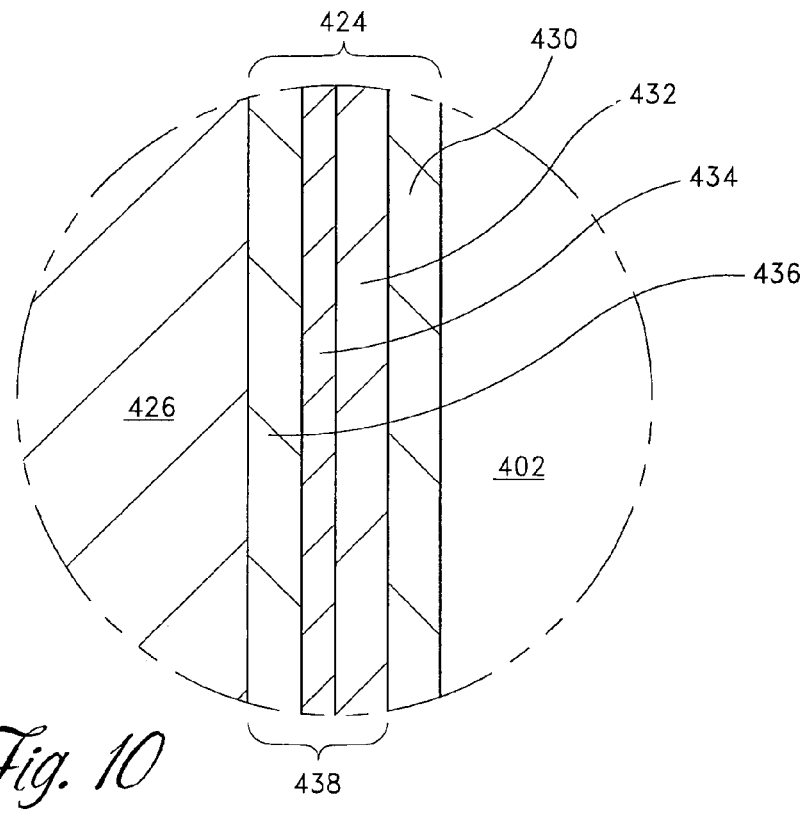
FIG. 10 is an enlarged view of the section 10-10 in FIG. 9, illustrating a graded transition layer formed between the barrier and metal layers.

With reference initially to FIGS. 9 and 10, a dual damascene structure 400 is shown, constructed in accordance with a preferred embodiment. In particular, an upper insulating layer 402 and a lower insulating layer 404 are formed above a conductive circuit element 406. The insulating layers 402, 404 can comprise conventional oxides, such as oxide from tetraethylorthosilicate (TEOS) or borophosphosilicate glass (BPSG), or they can comprise "low k" dielectrics in accordance with advanced process technology. The lower circuit element 406 typically comprises a lower metal layer or landing pad, but in some instances can comprise a semiconductor layer.

The structure 400 is also shown with an etch stop layer 408 between the insulating layers 402, 404, which can serve as a hard mask in the formation of the dual damascene structure, as will be appreciated by the skilled artisan. A lower insulating barrier layer 410 is also shown between the lower insulating layer 404 and the lower conductive layer 406. Such a layer is particularly advisable when the lower conductive element 406 or overlying metal layers comprise copper, which can easily diffuse through typical interlevel dielectrics and cause short circuits. Each of the hard mask 408 and barrier 410 can comprise silicon nitride or silicon oxynitride.

The dual damascene structure 400 is formed by providing trenches 420 in the upper insulating layer 402. The trenches 420 are typically formed in a desired pattern across the workpiece. A plurality of contact vias 422 (one shown) extend downwardly from the trenches 420 in discrete locations along the trenches 420 to expose underlying circuit nodes. Together, the trenches 420 and contact vias 422 are arranged in paths to interconnect underlying and overlying circuit elements in accordance with an integrated circuit design. The trenches and contacts are filled with conductive material to form these interconnects. The conductive material filling trenches 420 are referred to as metal runners, while the portions filling contact vias 422 are referred to as contacts. In dual damascene schemes, as shown, both trenches 420 and vias 422 are filled simultaneously, whereas in other schemes, the contacts and runners can be separately formed.

Typically, the dual damascene trenches and vias are first lined with lining layers 424 and then filled with a highly conductive material 426. In the illustrated embodiment, where the liners 424 are formed on all surfaces of the trenches 420 and vias 422, the liners 424 are conductive. In other arrangements, where the liners are selectively formed only on insulating surfaces, the liners need not be conductive. Lining layers can include adhesion layers, barrier layers and/or seed layers. Preferably, the lining layers 424 include at least two of adhesion, barrier and seed layers. In some embodiments, there is at least one interface region among the layers comprising a graded region or "transition layer" produced by an alternating layer deposition (ALD). In some embodiments, there are multiple transition layers. The transition layer(s) can be between the adhesion layer and the barrier layer, the barrier layer and the seed layer, between subparts of any of the above layers, or any other layers deposited via an ALD type process. In some embodiments discussed in greater detail below, the transition layer is between a barrier layer and a first seed layer, and/or a first seed layer and a second seed layer.

With reference to FIG. 10, in one embodiment, the lining layers 424 of the illustrated embodiment include an optional adhesion layer 430, characterized by good adhesion with the insulating surfaces 402, 404, 408, 410 (see FIG. 9) of the dual damascene structure. The adhesion layer can be formed by ALD processes, as disclosed in the provisional patent Application No. 60/159,799 of Raaijmakers et al., filed Oct. 15, 1999 and entitled CONFORMAL LINING LAYERS FOR DAMASCENE METALLIZATION, and the corresponding utility application Ser. No. 09/644,416 of Raaijmakers et al., filed Aug. 23, 2000 of the same title. The disclosure of the '799 application and corresponding '416 U.S. utility application is incorporated herein by reference.

The illustrated lining layers 424 further comprise a barrier region 432, a transition region 434 and a seed layer region 436. Preferably, the barrier region 432 comprises a conductive nitride, and particularly a metal nitride (e.g., WN, TiN, TaN, etc.). The transition region 434 also comprises a conductive nitride, but with varying levels of nitrogen through its thickness and/or different metal content. The seed region 436 preferably comprises a highly conductive "elemental" metal, having conductivity suitable for electroplating the filler metal 426 thereover. The actual addition of the filler material can be achieved in a variety of ways, including, for example, electroplating or metal organic chemical vapor deposition (MOCVD).

In one embodiment, the adhesion layer 430 comprises tungsten (W); the barrier region 432 comprises tungsten nitride ($WN_x$); the transition region 434 comprises a graded layer of tungsten copper nitride [$(WN_x)_yCu_z$], where y and z vary through the thickness of the transition region 434; and the seed region 436 comprises copper (Cu). Most preferably, the barrier 432, transition 434 and seed 436 regions are formed in a continuous process without removing the workpiece from the reaction chamber, and so from a process standpoint can be considered regions within a single deposited layer 438 having varying composition through its thickness.

The regions 432, 434, 436 can have any desired thickness suited to the particular application. For the preferred dual damascene context, the liners are preferably as thin as possible while accomplishing their respective purposes. In particular, the barrier region 432 serves as a diffusion barrier but preferably occupies as little of the trench and vias as possible. Accordingly, the barrier region 432 is preferably between about 20 Å and 200 Å, more preferably between about 40 Å and 80 Å, with an exemplary thickness for WN of about 50 Å. The transition region 434 transitions from metal nitride to pure metal while desirably avoiding electromigration during circuit operation and other deficiencies of sharp metal/metal nitride boundaries and minimizing overall thickness. Accordingly, the transition region 434 is preferably between about 7 Å and 200 Å, more preferably between about 10 Å and 80 Å. In one embodiment, the transition region has a thickness of about 10 Å and a copper content of about 0% at the interface with the barrier region 432 and a copper content of about 50% at the interface with the seed region 436 (or with the copper filler, in the absence of a seed layer). The seed region 436 should provide sufficient conductivity for uniform electroplating across the workpiece. While too thick a seed region 436 is not a functional disadvantage, throughput can be increased by depositing a minimum amount of copper by ALD while completing the fill by electroplating. Accordingly, the seed region 436 is preferably greater than about 100 Å, with an exemplary thickness for Cu of about 150 Å. In some embodiments, discussed in more detail below, multiple seed layers are used. Each of the layers has extremely good step coverage of the dual damascene trenches and vias, preferably greater than about 90% (ratio of sidewall coverage to field coverage), more preferably greater than about 93%, and most preferably greater than about 97%.

Figure 11:
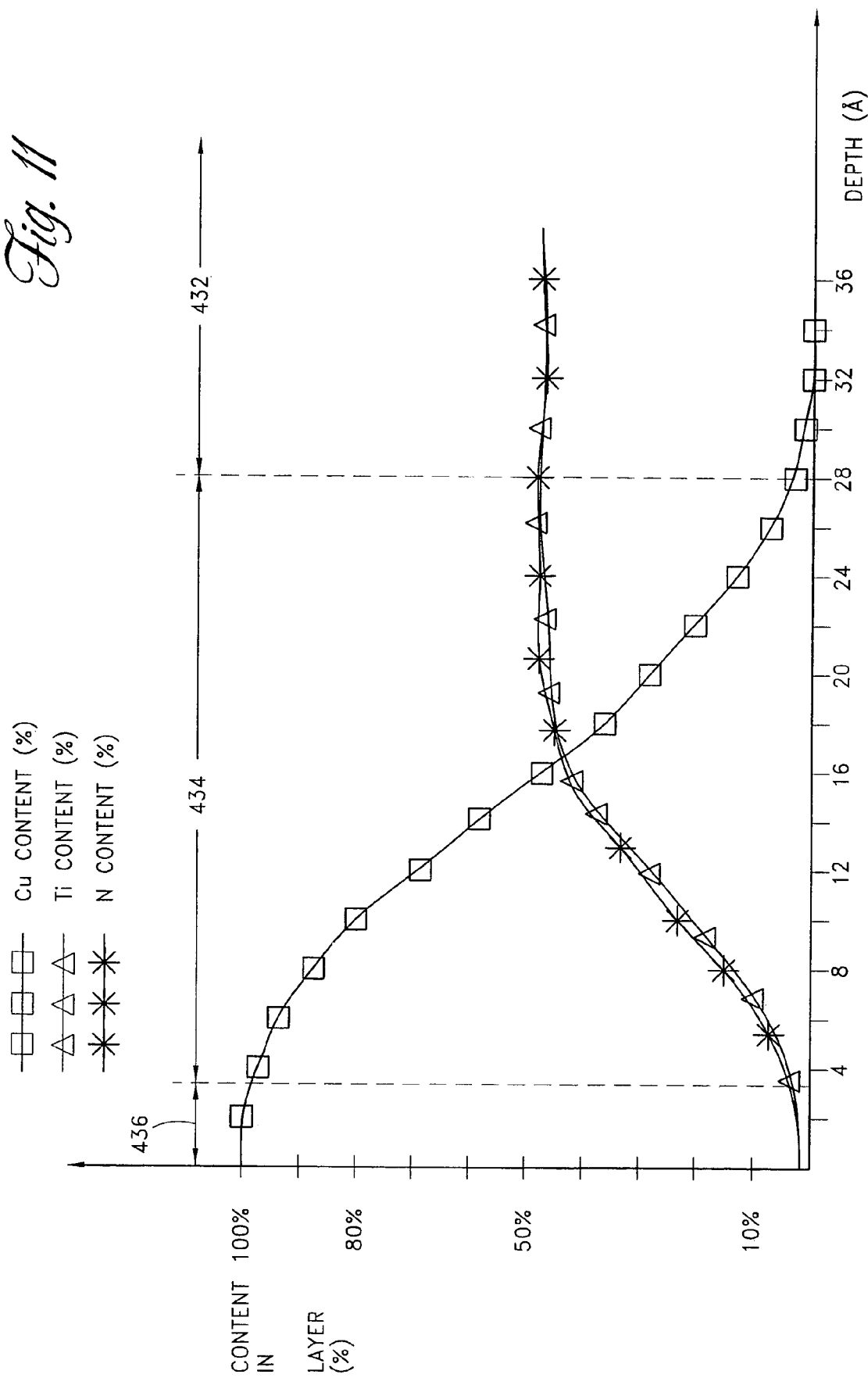
FIG. 11 is a theoretical Auger profile of a graded barrier-to-metal transition region, constructed in accordance with a preferred embodiment.

With reference to FIG. 11, a theoretical Auger profile is shown for an exemplary transition region 434 of FIG. 10. While FIG. 11 depicts a TiN and copper profile, it can also describe a WN and copper profile. For the WN and copper embodiment the right side of the graph represents the lower surface of the transition region 434 as it blends into the underlying WN barrier region 432. The left side of the graph represents the top surface of the transition region 434 as it blends into the overlying Cu seed region 436. As shown, the transition region has a gradually reduced W and N content, going from right to left, with a simultaneously increasing Cu concentration. It will be understood that the shape of the curves can take on any desired shape and the illustrated rates of content grading are merely exemplary.

Advantageously, the process employs an intermediate reduction phase to remove halide tails between metal and nitrogen source phases. This intermediate reduction phase avoids build up of hydrogen halides that could be harmful to metal later to be formed, such as copper. It will be understood, however, that in other arrangements the intermediate reduction phase can be omitted.

TABLE 1

| Pulse | Carrier Flow (slm) | Reactant | Reactant Flow (sccm) | Temperature (° C.) | Pressure (Torr) | Time (sec) |
|---|---|---|---|---|---|---|
| 1st metal | 400 | WF$_6$ | 20 | 350 | 10 | 0.25 |
| purge | 400 | — | — | 350 | 10 | 1.0 |
| 1st reduce | 400 | TEB | 40 | 350 | 10 | 0.05 |
| purge | 400 | — | — | 350 | 10 | 1.0 |
| nitrogen | 400 | NH$_3$ | 100 | 350 | 10 | 0.75 |
| purge | 400 | — | — | 350 | 10 | 1.0 |
| 2nd metal | 400 | CuCl | 4 | 350 | 10 | 0.2 |
| purge | 400 | — | — | 350 | 10 | 1.0 |
| 2nd reduce | 400 | TEB | 40 | 350 | 10 | 0.2 |
| purge | 400 | — | — | 350 | 10 | 1.0 |

With reference to Table 1 above, an exemplary process recipe for forming the desired graded layer, including barrier, transition and seed regions, will be described below. Five phases (each phase defined, in the illustrated embodiment, as including purge following reactant pulses) are described:

(1) a first metal phase (e.g., WF$_6$ pulse+purge);

(2) a first reduction phase (e.g., TEB pulse+purge pulse);

(3) a nitrogen phase (e.g., NH$_3$ pulse+purge pulse);

(4) a second metal phase (e.g., CuCl pulse+purge pulse); and (5) a second reduction phase (e.g., TEB pulse+purge pulse).

Varying proportions of these phases are utilized during the continuous deposition process, depending upon the stage of the deposition process. In the illustrated embodiment, during a barrier stage, for example, only phases (1)-(3) are employed, together representing one cycle that leaves no more than about one monolayer of WN. During a transition stage, varying proportions of phases (1)-(3) and (4)-(5) are employed. During a seed stage, only phases (4)-(5) are employed, together representing one cycle that leaves no more than about one monolayer of Cu.

In an alternative embodiment, the amount and order of the administration of the reactants is adjusted so that metal, nitrogen, and carbon; nitrogen and carbon; and metal and carbon liner layers can be part of the transition layers. These embodiments are discussed in greater detail further below. Examples of the individual stages discussed above will now be described in more detail.

Barrier Deposition Stage

During an initial barrier deposition stage, only a barrier material, preferably metal nitride, metal carbide, or metal nitride carbide, is deposited. In the illustrated embodiment discussed above, only phases (1)-(3) in Table 1 above are alternated. In about 120-180 cycles, about 50 Å of WN are produced. Each cycle can be identical.

In the first phase (1) of the first cycle, WF$_6$ chemisorbs upon the underlying substrate, which in the illustrated embodiment comprises a previously formed metal nitride. The metal nitride was most preferably formed by a similar ALD process. The first metal source gas preferably comprises a sufficient percentage of the carrier flow and is provided for sufficient time, given the other process parameters, to saturate the underlying barrier layer. No more than about a monolayer of tungsten complex is left upon the barrier layer, and this monolayer is self-terminated with fluoride tails. As noted above, though typically less than one monolayer, this complex will be referred to herein as a "monolayer" for convenience.

After the WF$_6$ flow is stopped and purged by continued flow of carrier gas, a second phase (2), comprising a pulse of reducing gas (TEB), is supplied to the workpiece. Advantageously, the reducing gas removes the fluoride tails from the tungsten complex, avoiding the formation of hydrogen halides that could etch copper. It will be understood that, in other arrangements, this reducing phase may not be necessary, or the addition of TEB can actually lead to depositing about a monolayer of carbon on the surface.

After TEB flow is stopped and purged, a third phase (3), comprising a pulse of nitrogen source gas (NH$_3$), is supplied to the workpiece. In this third phase, ammonia preferably comprises a sufficient percentage of the carrier flow and is provided for sufficient time, given the other process parameters, to saturate the surface of the metal-containing monolayer. The NH$_3$ readily reacts with the tungsten left exposed by the reducing phase, forming a monolayer of tungsten nitride (WN). The reaction is self-limiting. Neither ammonia nor the carrier gas further reacts with the resulting tungsten nitride monolayer, and the monolayer is left with a nitrogen and NH$_x$ bridge termination. The preferred temperature and pressure parameters, moreover, inhibit diffusion of ammonia through the metal monolayer.

Following the nitrogen phase (3), i.e., after the nitrogen source gas has been removed from the chamber, preferably by purging with continued carrier gas flow, a new cycle is started with the first phase (1), i.e., with a pulse of the first metal source gas (WF$_6$).

Desirably, this three-phase cycle (1)-(3) is repeated in a plurality of first cycles until sufficient barrier material is formed, preferably between about 20 Å and 200 Å, more preferably between about 40 Å and 80 Å, with an exemplary thickness of about 50 Å. Advantageously, this thin layer is provided with excellent step coverage.

In the illustrated embodiment, carrier gas continues to flow at a constant rate during all phases of each cycle. It will be understood, however, that reactants can be removed by evacuation of the chamber between alternating gas pulses. In one arrangement, the preferred reactor incorporates hardware and software to maintain a constant pressure during the pulsed deposition. The disclosures of U.S. Pat. No. 4,747,367, issued May 31, 1988 to Posa and U.S. Pat. No. 4,761,269, issued Aug. 2, 1988 to Conger et al., are incorporated herein by reference.

As will be appreciated by one of skill in the art, the above protocol can be adjusted as required to achieve the desired type of barrier layer. In some embodiments, tungsten can be replaced with other metals, such as molybdenum, niobium, tantalum and/or titanium. In some embodiments, the barrier layer comprises tungsten, nitrogen, and carbon. In an alternative embodiment the barrier layer comprises tungsten carbide. Carbon, can be supplied in the process along with either 1) tungsten or 2) tungsten and nitrogen. In one embodiment, this can be done through the addition of sufficient pulses of TEB in a specific sequence. In such an embodiment, phases 1) and 2) above can be reversed i.e., 1) TEB+Purge, followed by 2) WF$_6$+Purge, followed by 3) NH$_3$+Purge, for one full cycle. In some embodiments, the nitrogen is omitted from the barrier layer completely; thus, phases 1) and 2) can be reversed, and phase three removed (i.e., 1) TEB+purge, followed by 2) WF$_6$+purge, for one full cycle layer). Thus, there are various embodiments for the cycles involved in depositing the barrier layer.

Transition Deposition Stage

Following formation of the barrier region, in a continuous process, the cycles are altered to incorporate new phases during formation of the transition region. In particular, for the tungsten nitride (WN) barrier layer illustrated above, the fourth and fifth phases (4), (5) are introduced into the cycles in a plurality of second cycles, thereby introducing copper to the transition region. At least two, and preferably more than ten cycles, include the phases (4) and (5).

The introduction can be gradual. For example, two cycles can include only phases (1)-(3) as described above, producing WN, followed by a third cycle that includes all five phases (1)-(5), producing a mixture of WN and Cu, followed again by two cycles that include only phases (1)-(3). Gradually, the frequency of Cu introduction is increased. At some point, several cycles in a row would include all five phases (1)-(5). In some embodiments, eventually the fourth and fifth phases would be the primary phases that occur. Eventually, the fourth and fifth cycles can be the only phases that occur.

Figure 12:
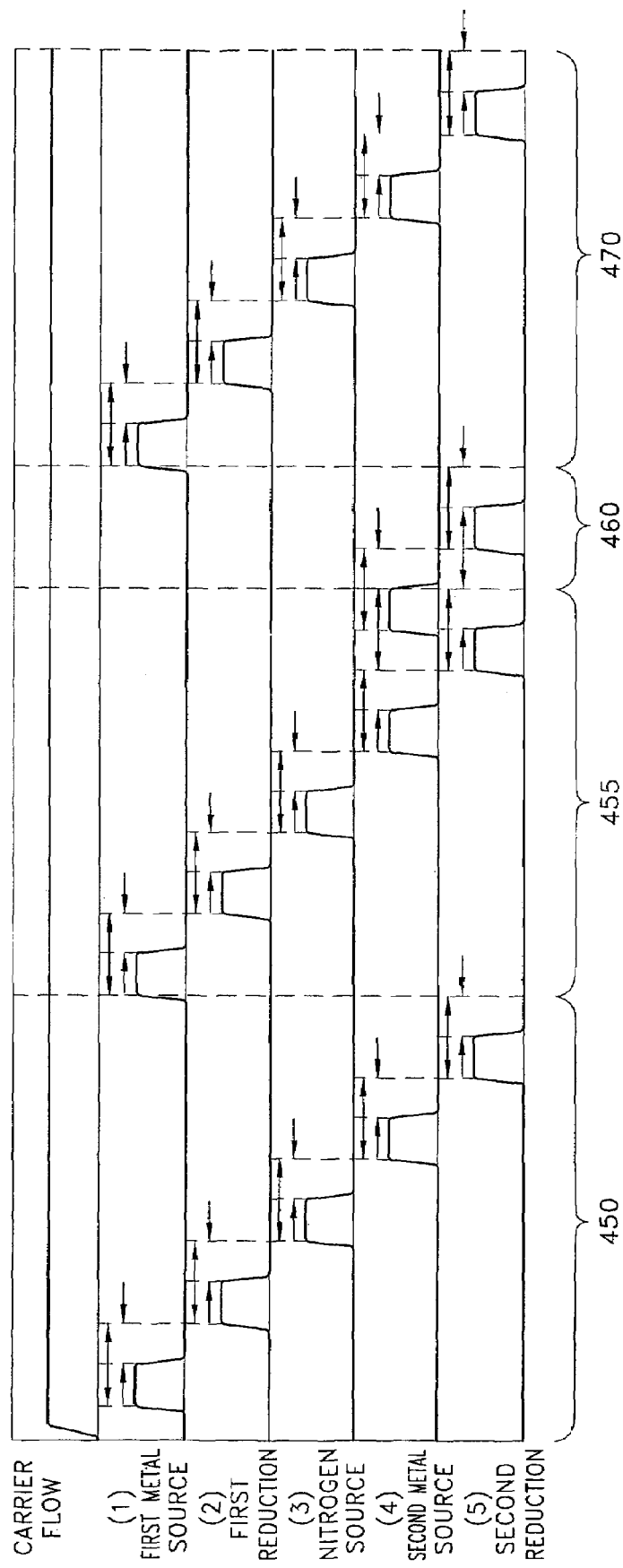
FIG. 12 is an exemplary gas flow diagram in accordance with one embodiment for depositing graded conductive layers.

Two such five-phase cycles are shown in FIG. 12, and Table 1 above presents parameters for one cycle of an ALD process for depositing of a graded layer of tungsten nitride (WN) and copper (Cu). Preferably the layer serves as an interface between a tungsten nitride barrier layer and a copper seed layer in trenches and contact vias of a dual damascene structure. In the exemplary process recipe, a first metal source gas comprises tungsten hexafluoride (WF$_6$); a carrier gas comprises nitrogen (N$_2$); a first reducing agent comprises triethyl boron (TEB), a nitrogen source gas comprises ammonia (NH$_3$); a second metal source gas comprises copper chloride (CuCl); and a second reducing agent comprises triethyl boron (TEB).

A first five-phase cycle 450 is shown in FIG. 12. Initially, the first three cycles (1)-(3) are conducted as described above with respect to the formation of the barrier region. Following the nitrogen phase (3), i.e., after the nitrogen source gas has been removed from the chamber, preferably by purging with continued carrier gas flow, a fourth phase (4) comprises flowing the second metal source gas. Copper chloride preferably comprises a sufficient portion of the carrier flow and is provided for sufficient time to saturate the surface left by the previous phase. No more than about a monolayer of self-terminated metal complex, particularly chloride-terminated copper, is left over the metal nitride formed by the previous two phases. The second metal source gas is then removed from the chamber, preferably purged by continued carrier gas flow.

In a fifth phase (5), the chloride-terminated surface is then reduced by flowing the reducing agent. Preferably, TEB flows to remove the chloride tails left by the previous phase.

In the next cycle 455, the first phase (1) again introduces the first metal source gas, which readily reacts with the surface of the copper monolayer, again leaving a fluoride-terminated tungsten layer. The second through fifth phases of the second cycle can then be added as described with respect to the cycle 450. These cycles can be repeated as often as desired to ensure sufficient intermixture of copper and metal nitride to avoid electromigration. A highly conductive layer can be deposited over the interface material by any suitable manner.

More preferably, some cycles are introduced that omit the WN formation, such that only phases (4) and (5) are included. In FIG. 12, this is represented by a truncated cycle 460, which omits the WN phases and instead consists of phases (4)-(5), producing no more than a monolayer of elemental Cu. The process then continues on with another five-phase cycle 470, mixing WN with Cu.

The frequency of WN phases (1)-(3) can be gradually reduced during progressive cycles, thereby increasing the Cu percentage of the growing layer. Eventually, only Cu deposition results. It will be understood that the relative proportion of WN to Cu in the transition region, and its profile, can be finely controlled by controlling the relative frequency of WN phases (1)-(3) as compared to Cu phases (4)-(5). Accordingly, any desirable content profile can be achieved by the methods disclosed herein.

Advantageously, this transition region can have composition variation through a very small thickness of the material. Preferably, the transition region of the illustrated embodiment, between a metal nitride barrier region and a metal seed region, is between about 7 Å and 200 Å, more preferably between about 10 Å and 80 Å, and particularly less than about 50 Å. An exemplary thickness for a metal/metal nitride transition region is about 10 Å. Advantageously, this thin layer is provided with excellent step coverage.

As will be appreciated by one of skill in the art in light of the present disclosure, the above process has been described in terms of individual phases that occur with changes in frequency or amount. As such, what is defined as a "cycle" can vary based on each round of application of material.

Alternatively, the process can be described in terms of pluralities of different types of cycles used for creating the various non-graded layers and how these various cycles overlap with one another. Thus, the above method can also be described as a plurality of first cycles (phases 1, 2, and 3 occurring repeatedly) that are repeated intermittently along with a plurality of second cycles (phases 4 and 5 occurring repeatedly).

The term "non-graded layer" refers to a layer that is generally composed of the same set of reactants throughout the whole layer and does not preclude local non-uniformities in composition; rather the term refers to a layer without a discernible trend in change of composition from the lower interface to the upper surface.

Figure 13:
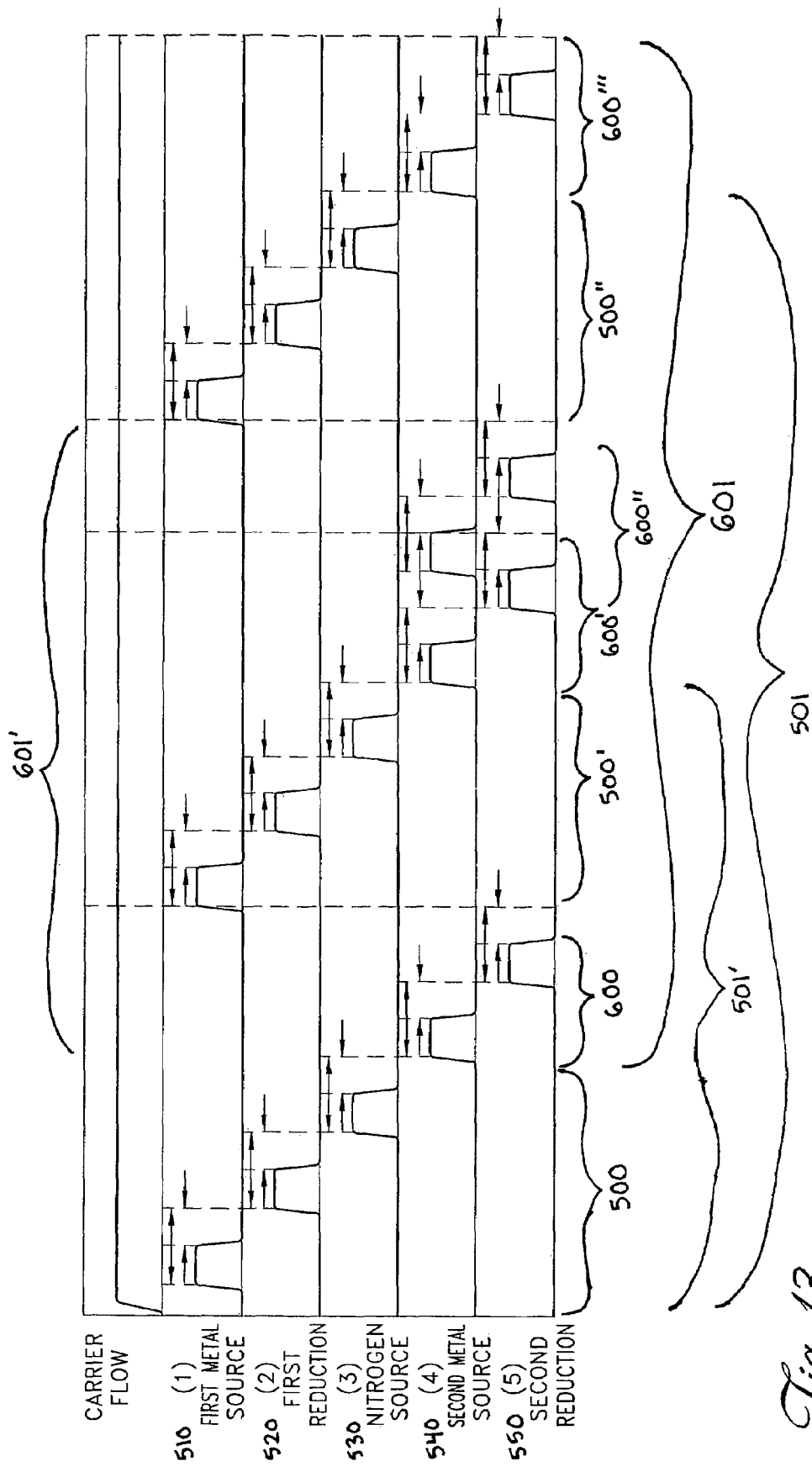
FIG. 13 is an exemplary gas flow diagram in accordance with another embodiment for depositing graded conductive layers.

When a plurality of first cycles and a plurality of second cycles are described to occur "at the same time," it does not require that the reactants or agents be supplied or reacted simultaneously. Each phase is still carried out separately and ended with a purge before the next phase begins. Rather, when a plurality of first deposition cycles and a plurality of second deposition cycles occur at the same time, it means that a second cycle is conducted before and after a first cycle, or vice versa. In other words, the cycles occur intermittently at any desired level of relative frequency (i.e., any desired ratio of first cycles: second cycles). For example, as shown in FIG. 13, where phase 1 510, phase 2 520, and phase 3 530 in a first cycle 500 are followed by phase 4 540 and phase 5 550 in a second cycle 600, the second cycle 600 has occurred "during" a plurality of first cycles, because there is a first cycle 500 before the second cycle 600 and there is a first cycle 500' after the second cycle 600. Thus, in this example, there are three first cycles 500, 500', 500" during the plurality of first cycles 501. Furthermore, there are four second cycles 600, 600', 600", 600'" during the plurality of second cycles 601. Of course, the plurality of cycles can be divided into smaller parts as well, as long as the different types of cycles are intermittent at some point in the process. Thus, a second cycle 600, can occur during a plurality of first cycles 500 and 500' as shown 501'. Alternatively, a first cycle 500' can occur during a plurality of second cycles 600, 600', 600" as shown 601'. Additionally, the following cycle need not occur immediately, as shown in FIG. 13, where two second cycles 600' and 600", occur consecutively before the next first cycle, 500". As mentioned above, other metals can be used instead of tungsten and include, for example, molybdenum, niobium, tantalum and/or titanium.

Alternative component Barrier Layers and Transition Layers

While the above section discusses creating a transition layer with respect to a two element barrier layer, one of skill in the art will recognize that this can be readily adjusted for alternative barrier layers, such as a tungsten, nitrogen, and carbon layer or a nitrogen and carbon layer. For example, while the TEB in the method described above acts as a reducing agent, by reversing the sequence of phase 1 and phase 2, so that TEB is applied and then the tungsten precursor, one can apply a similar method to achieve a transition layer between a WNC layer and a seed layer.

In such an embodiment, the barrier layer deposition process will still comprise three phases and the seed layer deposition process will also still comprise two phases so that the above discussion still applies; however, phase one and phase two have been reversed in their order. Thus, FIGS. 9, 10, and 12, with the adjustments depicted above, can also depict one method of depositing a WNC barrier and transition layer that comprises WNC and copper. FIG. 11 would be adjusted in that there would be a third element (namely carbon) in the barrier layer. Additionally, the depth can be increased, as additional layers are being added for each full barrier cycle.

In such an embodiment, a plurality of first deposition cycles (e.g., one cycle is TEB+purge, $WF_6$+purge, and $NH_3$+purge, which is repeated a number of times) allows for the formation of the barrier layer. After the barrier layer has been formed, but while this plurality of first deposition cycles is continuing, a plurality of second deposition cycles (e.g., the second cycles are copper-precursor+purge and reducing precursor+purge, which is repeated a number of times) is commenced, as described above. An example of this process follows.

EXAMPLE 1

First, an ALD process is used to deposit a non-graded layer of tungsten nitride carbide as a barrier layer. This is achieved through a first cycle that comprises supplying TEB, purging, supplying $WF_6$, purging, supplying $NH_3$, and purging. This first cycle is repeated a number of times, in a plurality of first cycles, to establish the barrier layer. Next, while the plurality of first cycles occurs, a second cycle is interspersed between the first cycles in the plurality of first cycles. In other words, the second cycle is added intermittently with the plurality of first cycles. This second cycle comprises supplying a copper-precursor, purging, supplying a reducing precursor, and purging. This second cycle is repeated a number of times, in a plurality of second cycles, which occurs during the plurality of first cycles to establish a transition layer. The transition layer will comprise both WNC and copper. The frequency of the plurality of second cycles starts off initially low, e.g., occurring once for every ten times the first cycle occurs; however, this frequency is preferably increased from the initial frequency over numerous cycles. Thus, after several cycles, the second cycle occurs ten times for every time the first cycle occurs.

In alternative embodiments, the barrier layer is a metal carbide instead of a metal nitride carbide. Thus, the plurality of first cycles will comprise a metal phase and a carbon depositing phase, but not the nitrogen depositing phase. Otherwise, this plurality of first cycles (TEB+purge and $WF_6$+purge) will occur intermittently during a plurality of second cycles, as described above.

Seed Deposition Stage
Seed layer

Following formation of the transition region, in a continuous process, a seed layer can be deposited in situ over the transition region. In the second embodiment discussed above, where a copper fill is desired within dual damascene trenches and contact vias, a seed layer is desired prior to electroplating.

Accordingly, the fourth and fifth phases of the illustrated WN barrier ALD process are repeated after the interface has formed. Thus, copper can be deposited by ALD over the interface of the mixed or compound layer (i.e., over the transition region) to provide a uniformly thick electroplating seed layer.

Desirably, the two-phase cycles are then continued without first metal and nitrogen phases until a copper layer is formed that is sufficiently thick to serve as an electroplating seed layer. This seed layer is preferably greater than about 50 Å, more preferably greater than about 100 Å, and in the exemplary embodiment is about 150 Å.

The wafer can then be removed from the chamber and the trenches and contact vias filled with a highly conductive metal. Preferably, copper is electroplated over the copper seed layer.

Thus, the metal nitride barrier, the graded interface or transition region and the copper seed region can all be deposited in situ in a continuous process, under the same temperature and pressure conditions. Advantageously, the mixed and more preferably graded interface or transition region avoids problems of electromigration that can occur at sharp metal/metal nitride interfaces during electrical operation of the integrated circuit.

The skilled artisan will appreciate that, in some arrangements, the relative level of reactants can be controlled by varying the constituents of a single reaction phase, as disclosed with respect to FIG. 7. Due to the complications of thermodynamic competition between simultaneously exposed reactants in an ALD process, however, it is more preferred to introduce constituent variation into the growing layer of by varying the number and/or type of phases in each cycle of the continuous process, as shown in FIG. 12.

Base Seed Layers

Figure 14:
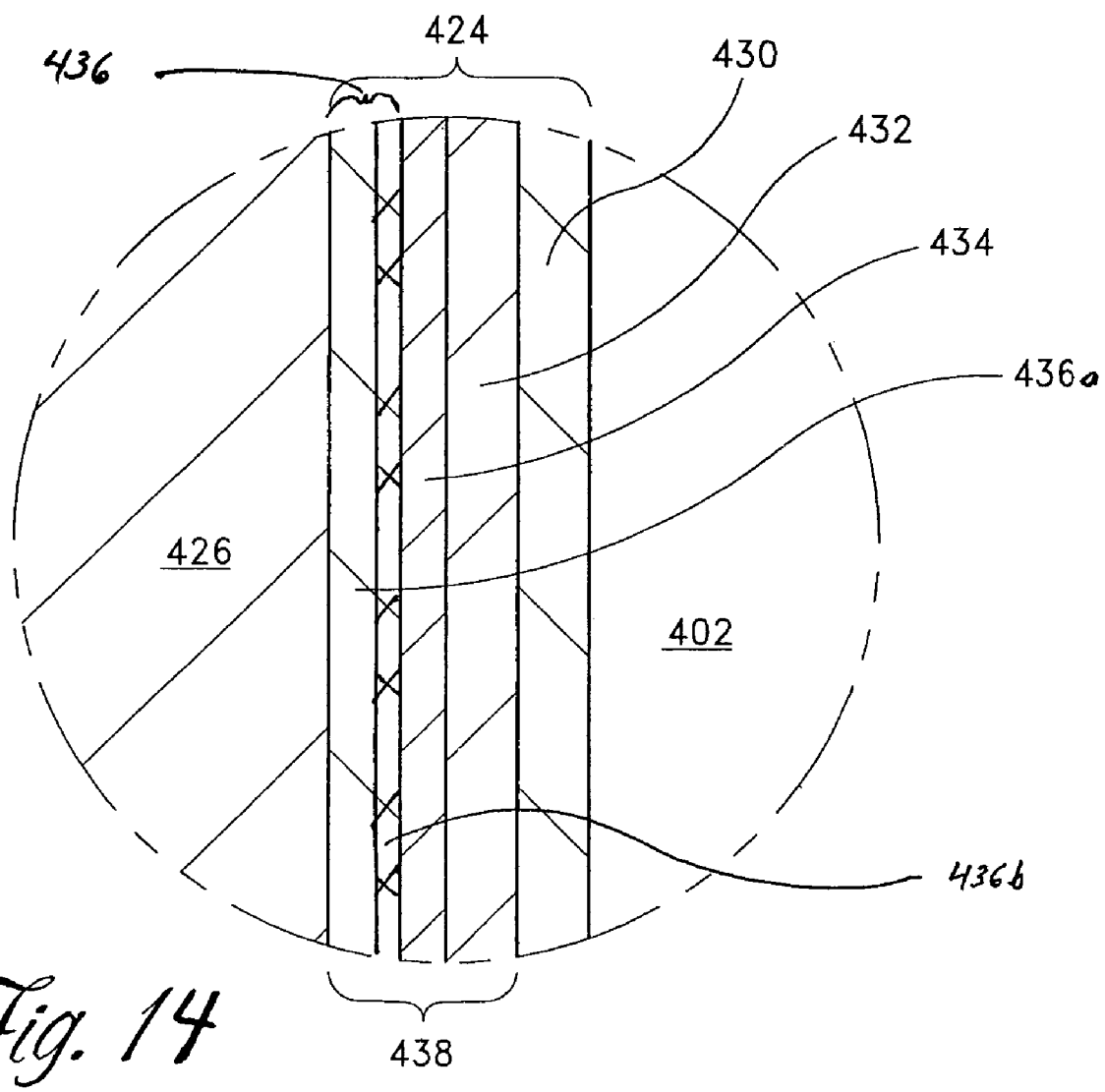
FIG. 14 illustrates the presence of a base seed layer in one embodiment.

In an alternative embodiment, the seed layer is more complex than the relatively simple seed layers 436 discussed above and comprises multiple layers. For example, the seed layer can be a compound seed layer 436, as shown in FIG. 14. In addition to the typical external seed layer 436a, these more complex seed layers also comprise a "base seed layer" 436b. This base seed layer 436b is positioned between the barrier layer 434 and the seed layer 436. These more complex seed layers can be used with the transition layers described above, or in situations where each of the layers in the liner layer are non-graded layers.

Figure 15A:
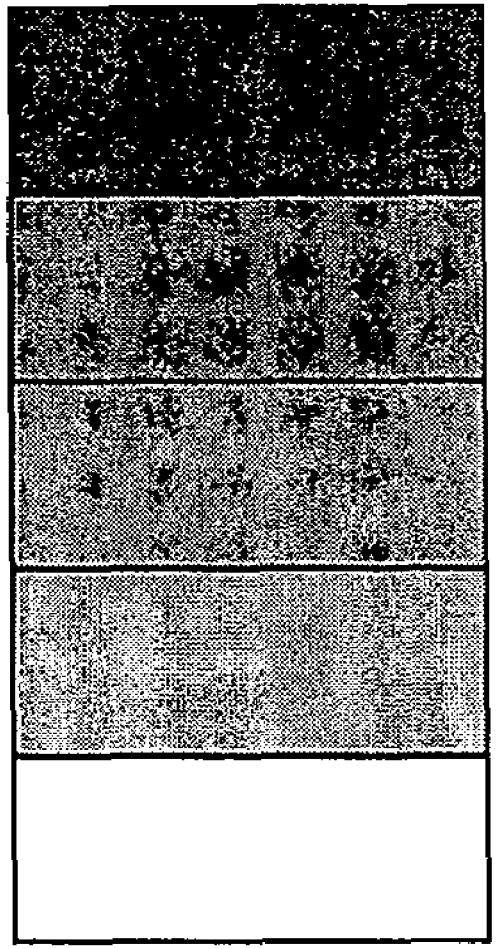
FIG. 15A depicts one embodiment of a liner layer.

The base seed layer 436b comprises a metallic layer, preferably with a metal upper surface. In a preferred embodiment, the base seed layer 436b is relatively free of nitrides or oxides, more preferably, it comprises tungsten, and most preferably, it consists essentially of tungsten. One such embodiment is shown in FIG. 15A. On top of an insulating layer 402, there is a barrier layer 432 upon which is a base seed layer of tungsten 436b. On top of the base seed layer 436b is an exterior seed layer 436a, upon which is an electroplated layer of conductive filler material 426, such as copper. In some embodiments, the base seed layer 436b comprises a metal that is present in the barrier layer 432 but not in the external seed layer 436a.

In a preferred embodiment, both seed layers 436a, 436b are deposited via an ALD process, thereby achieving high conformality for both the base seed layer 436b and the external seed layer 436a.

While some embodiments of the liner layers that involve base seed layers can still comprise one or more transition layers (discussed in greater detail below), such liner layers do not have to comprise a transition layer to have advantageous properties. Rather, the liner layer can comprise a non-graded barrier layer, e.g., a metal/nitride/carbide layer, with a base seed layer on top of it (e.g., a first metal layer), which then has the external seed layer on top of it (e.g., a second metal layer). More preferably, the liner layer comprises a first WNC layer, a second layer essentially consisting of tungsten, and a third layer comprising copper. Most preferably, all three layers have greater than 90% step coverage.

This liner layer with the base seed layer can be created by administering three types of cycles to a substrate. One type first creates the barrier layer in a plurality of first cycles. In the plurality of first cycles, one first introduces a carbon source onto a surface by atomic layer deposition (ALD), followed by introducing a metal source onto the surface, followed by introducing a nitrogen source onto the substrate. Between each of the pulses, the reaction chamber is preferably purged, but can also be pumped down to vacuum. In a preferred embodiment, the carbon source is TEB, the metal source is $WF_6$, and the nitrogen source is $NH_3$. This completes a first cycle. This cycle can be repeated until the desired thickness of tungsten nitride carbide barrier layer is achieved.

Next, a second type of cycle can be commenced to establish the base seed layer 436b. The plurality of second cycles comprises first introducing a metal source, purging the chamber, introducing a reducing agent, and then purging the chamber. In a preferred embodiment, the metal source is $WF_6$ and the reducing agent is either disilane or diborane. This second cycle can be repeated until the desired thickness of W is achieved.

Next, a third type of cycle is commenced for establishing the second or external seed layer 436a. The plurality of third cycles can comprise introducing a metal source, purging, introducing a reducing precursor, and finally purging. In a preferred embodiment, the metal source is an organometallic precursor, such as metal aminidinates (general formula $[M(R—R'AMD)_n]_x$, and more preferably a copper source, such as, Copper (N,N'-Diisopropylacetamidinate) ($[Cu(iPr-MeAMD)]_2$). In a preferred embodiment, the reducing precursor is hydrogen, although other reducing precursors such as $H_2$-plasma alcohols, boranes, silanes and ammonia can be used. The following describes exemplary ranges for some of the parameters for each of the first, second and third cycles.

In a preferred embodiment, the temperature during the first, second and third cycles is between 50° C. and 400° C., more preferably, between 150° C. and 350° C. In a preferred embodiment the thickness of the entire layer created by all of the three cycles is between 10 Å and 500 Å, more preferably between 30 Å and 100 Å, and most preferably between 40 Å and 80 Å.

1. First Cycle

In a preferred embodiment, the thickness of the non-graded layer from the first cycle (e.g., the barrier layer, e.g., WNC) is between 5 Å and 100 Å, more preferably between 10 Å and 60 Å, and most preferably between 15 Å and 40 Å.

2. Second Cycle

In a preferred embodiment, the thickness of the non-graded layer involving the second cycle (e.g., base seed layer, e.g., W) is between 5 Å and 200 Å, more preferably between 10 Å and 100 Å, and most preferably between 20 Å and 60 Å.

3. Third Cycle

In a preferred embodiment, the thickness of the non-graded layer involving the third cycle is between 5 Å and 500 Å, more preferably between 10 Å and 100 Å, and most preferably between 20 Å and 100 Å.

An example of such a method is provided below. Tables 2-4 presents some of the above ranges in a tabular format, as well as additional guidance for other relevant variables. Table 2 summarizes the ranges for the first cycle, in this case for the deposition of a barrier layer. Table 3 summarizes the ranges for the second cycle, in this case for the deposition of a base seed layer. Table 4 summarizes the ranges for the third cycle, in this case for the deposition of an external seed layer. The ranges in the present tables are arranged from a preferred, to a most preferred range.

TABLE 2

| Pulse | Carrier Flow (slm) | Reactant | Reactant Flow (sccm) | Temperature (° C.) | Pressure (Torr) | Time (sec) |
|---|---|---|---|---|---|---|
| Carbon | 0 to 100 | TEB | 5 to 5000 | 250 to 400 | $10^{-8}$ to 760 | 0.001 to 30 |
|  | 0 to 5 |  | 25 to 500 | 275 to 325 | 0.1 to 10 | 0.3 to 5 |
| Purge | 0 to 100 | — | — | — | $10^{-8}$ to 760 | 0.001 to 120 |
|  | 0 to 5 |  |  |  | 0.1 to 10 | 0.5 to 10 |
| 1st metal | 0 to 100 | $WF_6$ | 5 to 5000 | — | $10^{-8}$ to 760 | 0.001 to 30 |
|  | 0 to 5 |  | 5 to 100 |  | 0.1 to 10 | 0.05 to 2 |
| Purge | 0 to 100 | — | — | — | $10^{-8}$ to 760 | 0.001 to 120 |
|  | 0 to 5 |  |  |  | 0.1 to 10 | 0.5 to 10 |
| Nitrogen | 0 to 100 | $NH_3$ | 5 to 5000 | — | $10^{-8}$ to 760 | 0.001 to 30 |
|  | 0 to 5 |  | 25 to 500 |  | 0.1 to 10 | 0.3 to 5 |
| Purge | 0 to 100 | — | — | — | $10^{-8}$ to 760 | 0.001 to 120 |
|  | 0 to 5 |  |  |  | 0.1 to 10 | 0.5 to 10 |

TABLE 3

| Pulse | Carrier Flow (slm) | Reactant | Reactant Flow (sccm) | Temperature (° C.) | Pressure (Torr) | Time (sec) |
|---|---|---|---|---|---|---|
| 1st metal | 0 to 100 | WF$_6$ | 5 to 5000 | 50 to 400 | 10$^{-8}$ to 760 | 0.001 to 30 |
|  | 0 to 5 |  | 5 to 100 | 150 to 325 | 0.1 to 10 | 0.05 to 2 |
| Purge | 0 to 100 | — | — | — | 10$^{-8}$ to 760 | 0.001 to 120 |
|  | 0 to 5 |  |  |  | 0.1 to 10 | 0.5 to 10 |
| 1st reduce | 0 to 100 | Disilane or | 5 to 10000 | — | 10$^{-8}$ to 760 | 0.001 to 30 |
|  | 0 to 5 | diborane | 25 to 1000 |  | 0.1 to 10 | 0.3 to 5 |
| Purge | 0 to 100 | — | — | — | 10$^{-8}$ to 760 | 0.001 to 120 |
|  | 0 to 5 |  |  |  | 0.1 to 10 | 0.5 to 10 |

TABLE 4

| Pulse | Carrier Flow (slm) | Reactant | Reactant Flow (sccm) | Temperature (° C.) | Pressure (Torr) | Time (sec) |
|---|---|---|---|---|---|---|
| 2nd metal | 0 to 100 | [Cu(iPr-MeAMD)]$_2$ | 5 to 5000 | 50 to 400 | 10$^{-8}$ to 760 | 0.001 to 30 |
|  | 0 to 5 |  | 5 to 100 | 150 to 250 | 0.1 to 10 | 0.1 to 5 |
| Purge | 0 to 100 | — | — | — | 10$^{-8}$ to 760 | 0.001 to 120 |
|  | 0 to 5 |  |  |  | 0.1 to 10 | 0.5 to 10 |
| 2nd reduce | 0 to 100 | hydrogen | 5 to 10000 | — | 10$^{-8}$ to 760 | 0.001 to 30 |
|  | 0 to 5 |  | 25 to 1000 |  | 0.1 to 10 | 0.3 to 5 |
| Purge | 0 to 100 | — | — | — | 10$^{-8}$ to 760 | 0.001 to 120 |
|  | 0 to 5 |  |  |  | 0.1 to 10 | 0.5 to 10 |

In some embodiments, the deposition of the base seed layer 436b is via an ALD process. In a more preferred embodiment, the deposition of each of the base seed layers 436b and the external seed layer 436a occurs via an ALD process.

EXAMPLE 2

This Example describes how a WNC, W, Cu layer can be created, as shown in FIG. 15A. First, WNC is deposited via cycles of ALD until a desired thickness is achieved. TEB is introduced to the chamber at a flow rate of 200 sccm for 2.0 seconds. The substrate is set to a temperature of 300° C., purged, WF$_6$ is introduced at a flow rate of 50 sccm for 0.3 seconds, purged, NH$_3$ is introduced at a flow rate of 200 sccm for 1.0 seconds, and then purged in a first cycle. This cycle is repeated until the desired thickness is achieved. Following this, the plurality of second cycles is started. WF$_6$ is introduced at a flow rate of 30 sccm for 0.5 seconds, purged, disilane or diborane is introduced at a flow rate of 500 sccm for 2 seconds, and then purged. This is repeated until the desired thickness is achieved. Following this, the plurality of third cycles is started. Cu-precursor is introduced at a flow rate of 100 sccm for 2 seconds, purged, the reducing precursor is introduced at a flow rate of 500 sccm for 2 seconds, and purged. This is repeated until the desired thickness is achieved.

Figure 15B:
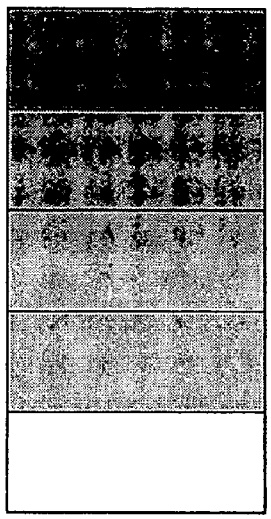
FIG. 15B depicts another embodiment of a liner layer.
Figure 15C:
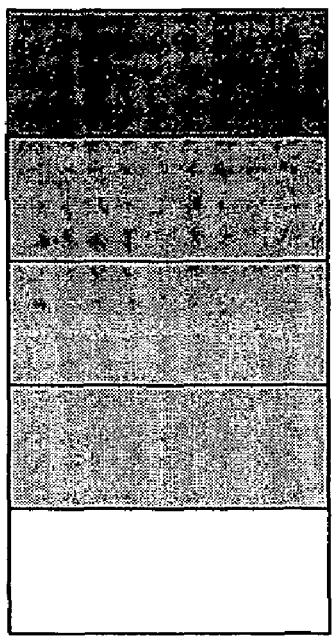
FIG. 15C depicts another embodiment of a liner layer.

As will be appreciated by one of skill in the art, the above example concerning a W base seed layer and a Cu external seed layer does not contain a transition layer. However, such transition layers can easily be added. For example, as discussed below, a transition layer between the WNC layer and the W layer (as shown in FIG. 15B and Example 3), and/or a transition layer between the W layer and the copper layer (as shown in FIG. 15C and Example 4) can be created. Additionally, in some embodiments, only a single transition layer is desired; for example, a transition layer between the first layer, e.g., WNC, and the second layer, e.g., W. The following example describes one method of making such a structure.

EXAMPLE 3

A substrate is placed into a reaction chamber. First, a cycle involving introducing TEB, purging, introducing WF$_6$, purging, introducing NH$_3$, and purging is performed and repeated. The cycle is repeated a sufficient number of times to create a desired thickness.

Next a graded layer between the WNC layer and the following W layer is created. This process comprises alternating between the first cycle described above and a second cycle with varying frequencies. The second cycle comprises introducing WF$_6$, purging, introducing disilane or diborane, and purging. The frequency of the occurrence of the first cycle, initially, is very high, while the frequency of occurrence of the second cycle, over the same time period is relatively low. However, as additional layers are added, the frequency of occurrence of the second cycle increases and the frequency of occurrence of the first cycle decreases. Initially, the first cycle occurs 10 times for every time the second cycle occurs. At the end of the formation of the transition layer, the second cycle occurs 10 times for every time the first cycle occurs. This can be viewed as intermittently (and with greater frequency) omitting the nitrogen and carbon phases as the deposition proceeds.

Finally, by a third cycle, a layer of copper is deposited. This comprises introducing a Cu-precursor, e.g., Copper (N,N'-Diisopropylacetamidinate), purging, introducing a reducing precursor, e.g., hydrogen, and purging. As above, this is repeated until the desired thickness is achieved. This process can result in forming the structure depicted in FIG. 15B. Thus, the liner layer can comprise a WNC barrier layer 432, on top of a low-k layer 402. On top of the barrier layer 432 is a transition layer 436b' that also serves as a base seed layer and is a graded mix of tungsten and WNC, preferably with a high percent or pure section of tungsten at the top surface. On top of this layer 436b', is the external seed layer 436a that includes copper, upon which sits an electroplated layer of copper 426.

In alternative embodiments, the first layer and cycle comprises a metal carbide (e.g., tungsten and nitrogen) but lacks the nitride. Thus, the first layer and cycle will lack any nitrogen reactant.

Complex Transition Liners

While some of the previous sections discussed individual graded layers, one of skill in the art will realize that relatively complex liner layers are possible given the present teachings. For example, liner layers or other layers comprising multiple transition layers can also be created by the teachings herein.

For example, in some embodiments, the liner layer can have multiple transition layers. In some embodiments, there is a transition layer on each side of the barrier layer. For example, there can be a transition layer between the barrier layer and the adhesion layer and there can also be a transition layer between the barrier layer and the seed layer. In some embodiments, where there are multiple seed layers as discussed above, there can be multiple transition layers, with and/or between the seed layers.

In a preferred embodiment, the process for generating a liner layer with multiple transition layers is similar to that described above, involving multiple cycles with multiple phases (phases 1-5, described above and e.g., phases 6 and 7 for the additional layer and transition layer) and changing the frequencies of the phases or cycles to gradually increase the amount of one element or compound compared to another element or compound.

For example, in a first part of the deposition, as above, a plurality of first cycles can be used to establish a first layer of non-graded material. In a second part of the deposition, as above, the plurality of first cycles can continue to occur, but is interspersed with a plurality of second cycles, with increasing frequency as deposition proceeds, allowing for a transition layer to be formed. In a new, third part, of the deposition, a plurality of third cycles is interspersed, with increasing frequency as deposition proceeds, with an ongoing plurality of cycles. This will allow one to add a second transition layer. The second transition layer can comprise the material from the plurality of second cycles and the material from the plurality of third cycles.

In a preferred embodiment, the plurality of first cycles is stopped before the plurality of third cycles is commenced. In a more preferred embodiment, there are periods over which only the first, only the second, or only the plurality of third cycles occurs, thus allowing for non-graded layers of the material from the first, second and plurality of third cycles to be created.

As will be appreciated by one of skill in the art, just like for the first and plurality of second cycles described above, the number and type of elements in each of the phases that make up the plurality of third cycles is only limited by what one wants incorporated into the completed layer.

In one embodiment the plurality of third cycles is to deposit an external seed layer and the plurality of second cycles is to deposit a base seed layer. In such a situation, the plurality of third cycles can be similar to that of the plurality of second cycles described above, e.g., a copper and reducing precursor combination. In such a situation, the plurality of second cycles will be different, for example, it can essentially consist of tungsten, a reducing precursor, and purges. Thus, the plurality of second cycles can comprise a phase of supplying $WF_6$ and purging and a phase of supplying disilane/diborane and purging. The plurality of third cycles can comprise a phase of supplying a copper precursor and purging and a phase of supplying a reducing precursor and purging. An example of this process is demonstrated below.

EXAMPLE 4

This example demonstrates one method of making a graded liner layer with two transition layers. In particularly, the transition layers are involved in seed layers.

First, one establishes a barrier layer in a damascene trench via an ALD process. One first supplies TEB to the substrate, purges, supplies $WF_6$, purges, supplies $NH_3$, and purges. This combination of phases represents one complete cycle. The cycle is repeated, in a plurality of first deposition cycles, until a barrier layer of a desired depth is achieved.

Next, one continues the plurality of first deposition cycles described above, while also commencing a plurality of second deposition cycles, interspersed between completed first cycles. The second cycle comprises supplying $WF_6$, purging, supplying disilane or diborane and purging. This second cycle is repeated, thus establishing a plurality of second cycles. Both the first and the plurality of second cycles occur over a set number of cycles, thus establishing a first transition layer. Initially, the frequency of the first cycle is greater than the frequency of the second cycle (e.g., >5:1); eventually, this frequency is reversed (e.g., <1:5) towards the top of the transition layer.

Next, one continues the plurality of second deposition cycles, alone, a number of times to establish a desired thickness of the base seed layer.

Next, one continues the plurality of second deposition cycles described above, while also commencing a plurality of third deposition cycles, interspersed between the second cycles. The third cycle comprises supplying a copper-precursor, purging, supplying a reducing precursor, and purging. This third cycle is repeated, thus establishing a plurality of third cycles. Both the second and the plurality of third cycles occur over a set number of cycles, thus establishing a second transition layer. Initially, the frequency of the second cycle is greater than the frequency of the third cycle (e.g., >5:1); eventually, this frequency is reversed (e.g., <1:5) towards the top of the transition layer.

Next, one continues the plurality of third deposition cycles, alone, a number of times to establish a desired thickness of the external seed layer. This combined process can result in forming the structure depicted in FIG. 15C. Thus, the liner layer can include a WNC barrier layer 432, on top of a low-k layer 402. On top of the barrier layer 432 is a transition layer 436b' that also serves as a base seed layer and is a graded mix of tungsten and WNC, with increasing W content toward the top surface, preferably terminating in an essentially pure W surface. On top of this layer 436b', is a graded external seed layer 436a' that includes a graded layer of copper and tungsten with increasing copper content toward the top surface, upon which sits an electroplated layer of copper 426.

While the above example is directed to particular materials, the general method of creating compound layers with one or multiple transition layers can be expanded for different types of layers, for example, liner layers with or without nitride or carbide barrier layers.

In some embodiments, the liner layer that is created has a first non-graded layer that essentially consists of a first metal and nitrogen; a first metal, nitrogen, and carbon; or a first metal and carbon. On top of this first non-graded layer is a second non-graded layer 720, of the first metal. On top of the second non-graded layer is a third non-graded layer 730. The third non-graded layer 730 includes a second metal, and in one embodiment consists essentially of copper or a copper alloy.

Figure 15D:
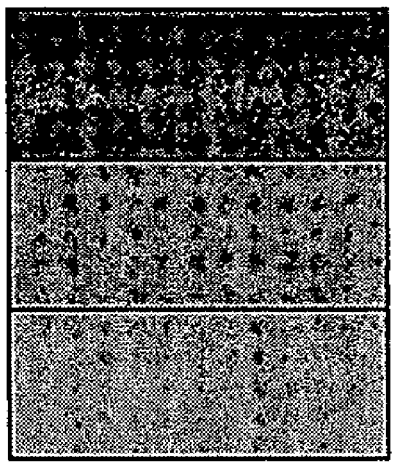
FIG. 15D depicts another embodiment of a liner layer.

In alternative embodiments, the liner layers described in FIG. 15D can have multiple transition layers. As depicted in FIG. 15D, there is a bottom barrier layer 710 that includes a metal (e.g., W, Ti, or Ta) combined with either, nitrogen, carbon, or nitrogen and carbon. On top of the barrier layer 710 is a metal layer 720, which includes the same metal (e.g., W, Ti, or Ta) that is present in the barrier layer 710. Between the barrier layer 710 and the metal layer 720 can be a transition layer (not shown) that includes both the metal and 1) nitrogen, 2) nitrogen and carbon, or 3) carbon, in a graded manner. On top of the metal layer 720 is another metal layer 730 that includes a different metal (e.g., Ru or Cu). Between the two different metal layers 720, 730 can be another transition layer (not shown), which again includes both metals in a graded manner.

Likewise, while the above describes a liner with non-graded layers in it, these non-graded layers can be removed or effectively reduced to one cycle's worth of layer if so desired, so that the entire liner consists of various graded layers.

Figure 15E:
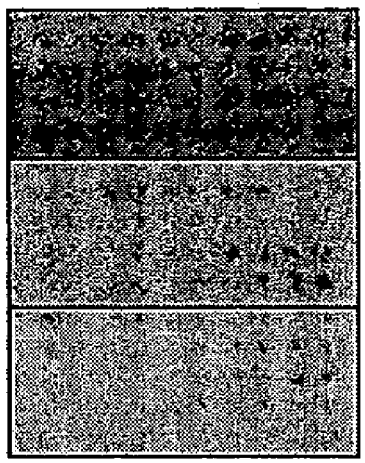
FIG. 15E depicts another embodiment of a liner layer.

Additionally, the above process can also be used for different liner layers. For example, as shown in FIG. 15E, in one embodiment, the liner layer can include three different metals in three non-graded layers. In a preferred embodiment, the bottom metal 760 is tungsten, with a second metal layer 770, e.g., ruthenium, placed over the bottom layer, and a third metal layer 780, e.g., copper, placed over the second metal layer.

In a preferred embodiment, the liner layer in FIG. 15E includes two transition layers (not shown) between the three non-graded layers of each of the metals. In a more preferred embodiment, the bottom metal 760 is tungsten, with a second metal layer 770, e.g., ruthenium, placed over the bottom layer, and a third metal layer 780, e.g., copper, placed over the second metal layer. Thus, there is a first transition layer of tungsten and ruthenium and a second transition layer of copper and ruthenium.

As will be appreciated by one of skill in the art, the above transition layers can gradually and consistently transition between the two non-graded layers. The transition between materials in the layer can be linear, parabolic, or any other gradation between a starting point and an ending point. For example, the majority of the transition can be either earlier or later in the transition layer. This can be determined by altering the frequencies of the relevant cycles. Additionally, the above graded liner layers and layers with containing multiple seed layers can be especially useful for lining a damascene trench.

Grading Using Replacement Reactions

In the first of the above-described embodiments, an impurity is described as being introduced in the gas phase as one of the primary reactants (e.g., increasing proportions of nitrogen provided as the same time as the oxidant in the process of FIG. 7). In the following embodiments, the impurity (e.g., second or third cycles) is introduced by separate pulses in selected cycles of the ALD process. Impurity pulses can substitute for pulses in the initial process, or can be provided in addition to the primary reactants, and these pulse introductions can be provided with increasing frequency throughout the process (e.g., the copper source gas pulses can be added to or substituted for tungsten and nitrogen source gas pulses in the process of FIG. 12).

Additionally, the inventors have found that the impurity can be introduced by way of the thermodynamically favored replacement of already-adsorbed species in the growing film. For example, in the process of growing a $TiO_2$ layer by ALD, introduction of an aluminum chloride ($AlCl_3$) gas pulse can replace Ti—O bonds with Al—O bonds, which are thermodynamically favored, and in the process liberate volatile $TiCl_4$ gas. Similarly, a pulse of $AlCl_3$ can convert surface $SiO_2$ to $Al_2O_3$, liberating $SiCl_4$ gas. In another example, $ZrO_2$ at the surface of a growing layer can be exposed to $AlCl_3$ to form $Al_2O_3$. These examples are particularly advantageous in forming an upper interface between bulk $TiO_2$, $SiO_2$ or $ZrO_2$ dielectric and the gate electrode to be formed thereover.

Because the replacement reaction is thermodynamically favored, an extended exposure can replace one or two molecular layers of the less favored oxide with $Al_2O_3$. If such full layer replacement is desired in the grading process, such exposures can be infrequently introduced in the ALD process early in the deposition, with the greater frequency towards the end of the process to produce a largely or purely $Al_2O_3$ upper surface. Conversely, such exposures can be frequently introduced early in the ALD process, and with less frequency later in the process to produce a largely or purely $Al_2O_3$ lower surface graded into the bulk dielectric.

Alternatively, less than full substitution of $Al_2O_3$ for $TiO_2$, $SiO_2$ or $ZrO_2$ can be accomplished in each $AlCl_3$ pulse by selecting a shortened time span for the $AlCl_3$ pulse. The exposure time for the substitution reaction can be progressively increased with each cycle or every few cycles during the process, thus accomplishing a greater proportion of $Al_2O_3$ at the upper surface of the growing dielectric layer. Where grading is accomplished by varying exposure time, it is advantageous to supply reactant gases perpendicularly to the substrate, such as by way of an overhead showerhead inlet. Thus concentration gradients from the inlet side to the exhaust side of the substrate can be avoided.

It has been shown that, even with a positive Gibb's free energy value for a substitution reaction, a long enough exposure to the substituting source gas can result in eventual replacement of the top molecular layer of the growing dielectric. See Jarkko Ihanus, Mikko Ritala, Markku Leskelä and Eero Rauhala, ALE growth of $ZnS_{1-x}Se_x$ thin films by substituting surface sulfur with elemental selenium, "APPLIED SURFACE SCIENCE, Vol. 112, pp. 154-158 (1997). In that case, it was shown that exposure of a sulfide or —SH surface termination to pure selenium will result in replacement of the sulfur atoms with selenium.

It will be understood that similar substitution reactions can also be employed for grading conductive materials, such as metal nitrides with different metals per the graded barrier layer described above.

Although the foregoing invention has been described in terms of certain preferred embodiments, other embodiments will become apparent to those of ordinary skill in the art in view of the disclosure herein. In particular, the number of phases for each cycle can be varied. Intermediate reduction phases, for example, may not be necessary in some arrangements. Additionally, while one embodiment is disclosed in the context of conductive thin films lining a dual damascene structure, and another embodiment is disclosed in the context of ultrathin gate dielectric films, the skilled artisan will readily find application for the principles disclosed herein in a number of different contexts.

Accordingly, the present invention is not intended to be limited by the recitation of preferred embodiments, but is intended to be defined solely by reference to the dependent claims.

We claim:

1. A graded liner layer in a damascene trench comprising:
a first non-graded layer comprising a first compound;
a second non-graded layer, above said first non-graded layer, said second non-graded layer comprising a first metal, wherein between said first and second non-graded layers is a first transition layer comprising both the first compound and the first metal, and wherein the first transition layer has greater than 90% step coverage; and a third non-graded layer, above said second non-graded layer, comprising a second metal, wherein between the second and third non-graded layers is a second transition layer comprising the first metal and the second metal, wherein the layers are located within a damascene trench.

2. The graded liner layer of claim 1, wherein said second metal is copper.

3. The graded liner layer of claim 2, wherein said first metal is tungsten.

4. The graded liner layer of claim 1, wherein said first compound is selected from the group consisting of: 1) the second metal and nitrogen, 2) the second metal and nitrogen and carbon, 3) the second metal and carbon, and 4) a third metal.

5. The graded liner layer of claim 1, wherein the second transition layer has greater than 90% step coverage, and wherein the second non-graded layer has greater than 90% step coverage.

6. A liner layer comprising:
a first non-graded layer comprising a barrier compound, wherein the first non-graded layer has greater than 90% step coverage;
a second non-graded layer, above said first non-graded layer, said second non-graded layer essentially consisting of tungsten, wherein the second non-graded layer has greater than 90% step coverage; and
a third non-graded layer comprising a seed compound, wherein said third non-graded layer is above said second non-graded layer, and wherein the third non-graded layer has greater than 90% step coverage.

7. The liner layer of claim 6, wherein the first non-graded layer comprises a compound with elements selected from the group consisting of: tungsten, nitrogen, carbon, and a combination thereof.

8. The liner layer of claim 7, further comprising a first transition layer between the first and second non-graded layers, wherein said first transition layer comprises tungsten and the barrier compound.

9. The liner layer of claim 8, further comprising a second transition layer between the second and third non-graded layers, wherein the second transition layer comprises tungsten and a seed compound.

10. The liner layer of claim 6, further comprising a first transition layer between the second and third non-graded layers, wherein the first transition layer comprises tungsten and a seed compound.

11. The liner layer of claim 6, wherein the seed compound comprises copper.

12. The liner layer of claim 6, wherein the first non-graded layer comprises tungsten, nitrogen, and copper, and wherein the seed compound comprises copper.

13. The liner layer of claim 6, wherein the first non-graded layer comprises tungsten, nitrogen, and copper, and wherein the first transition layer comprises tungsten, nitrogen, and copper.

14. The liner layer of claim 6, wherein the first non-graded layer comprises tungsten, nitrogen, and copper, wherein the first transition layer comprises tungsten, nitrogen, and copper, wherein the second transition layer comprises tungsten and copper, and wherein the seed compound comprises copper.

15. The liner layer of claim 6, wherein the liner layer is on top of a low-k dielectric surface.

16. The liner layer of claim 6, wherein the seed compound consists of copper.

17. The liner layer of claim 6, wherein the first non-graded layer consists essentially of tungsten, nitrogen, and copper.

* * * * *

UNITED STATES PATENT AND TRADEMARK OFFICE
CERTIFICATE OF CORRECTION

PATENT NO. : 7,419,903 B2 Page 1 of 1
APPLICATION NO. : 11/106220
DATED : September 2, 2008
INVENTOR(S) : Haukka et al.

It is certified that error appears in the above-identified patent and that said Letters Patent is hereby corrected as shown below:

Title Page; item (56);

On Page 2, Col. 2, line 23, under Other Publications, please change "Films" to --Film.--.

On Page 3, Col. 1, line 2, under Other Publications, please change "Oxygen," to --Oxidation--.

In Col. 23, line 34 (approx.), please change "carbon)in" to --carbon)_in--.

Signed and Sealed this

Third Day of March, 2009

JOHN DOLL
*Acting Director of the United States Patent and Trademark Office*